(12) United States Patent
Harada et al.

(10) Patent No.: US 8,035,232 B2
(45) Date of Patent: Oct. 11, 2011

(54) SEMICONDUCTOR DEVICE INCLUDING INTERCONNECTS, VIAS CONNECTING THE INTERCONNECTS AND GREATER THICKNESS OF THE LINER FILM ADJACENT THE VIAS

(75) Inventors: Takeshi Harada, Shiga (JP); Junichi Shibata, Hyogo (JP); Akira Ueki, Osaka (JP)

(73) Assignee: Panasonic Corporation, Osaka (JP)

( * ) Notice: Subject to any disclaimer, the term of this patent is extended or adjusted under 35 U.S.C. 154(b) by 172 days.

(21) Appl. No.: 12/437,944

(22) Filed: May 8, 2009

(65) Prior Publication Data

US 2009/0278261 A1   Nov. 12, 2009

(30) Foreign Application Priority Data

May 12, 2008  (JP) ................................. 2008-125135

(51) Int. Cl.
*H01L 23/48* (2006.01)
*H01L 23/52* (2006.01)
*H01L 29/40* (2006.01)

(52) U.S. Cl. ........................................ 257/774; 257/775

(58) Field of Classification Search ................... 257/774, 257/775, E23.145, E21.584, E21.577
See application file for complete search history.

(56) References Cited

U.S. PATENT DOCUMENTS 7,391,115 B2   6/2008  Usami et al.

2003/0116854 A1 *  6/2003  Ito et al. ........................ 257/761
2006/0163739 A1   7/2006  Komai et al.
2006/0202336 A1   9/2006  Kajita et al.

FOREIGN PATENT DOCUMENTS

| JP | 2006-135220 | | 5/2006 |
| JP | 2006135220 | * | 5/2006 |
| WO | WO 00/19498 | | 4/2000 |

OTHER PUBLICATIONS

Japanese Notice of Reasons for Rejection, w/ English translation thereof, issued in Japanese Patent Application No. JP 2008-125135 dated Jul. 6, 2010.
Arnal, V., et al., "45 nm Node Multi Level Interconnects with Porous SiOCH Dielectric k=2.5", 2006, pp. 213-215, IITC.

* cited by examiner

*Primary Examiner* — William M. Brewster
(74) *Attorney, Agent, or Firm* — McDermott Will & Emery LLP

(57) ABSTRACT

An interlayer insulating film is formed on the upper surface of a semiconductor substrate, and lower-level interconnects are formed in the interlayer insulating film. A liner insulating film is formed on the upper surfaces of the interlayer insulating film and lower-level interconnects. An interlayer insulating film is formed on the upper surface of the liner insulating film. Upper-level interconnects are formed in the interlayer insulating film. The lower-level interconnects and the upper-level interconnects are connected with each other through vias. Parts of the liner insulating film formed in via-adjacent regions have a greater thickness than a part thereof formed outside the via-adjacent regions.

26 Claims, 18 Drawing Sheets

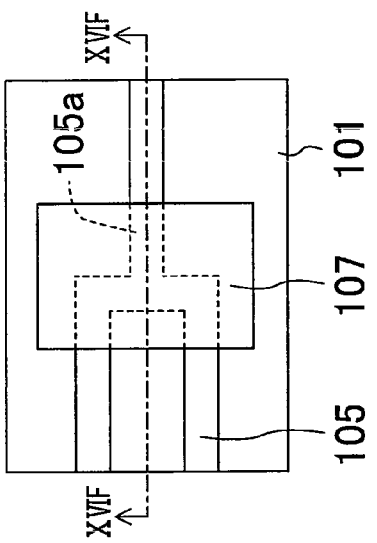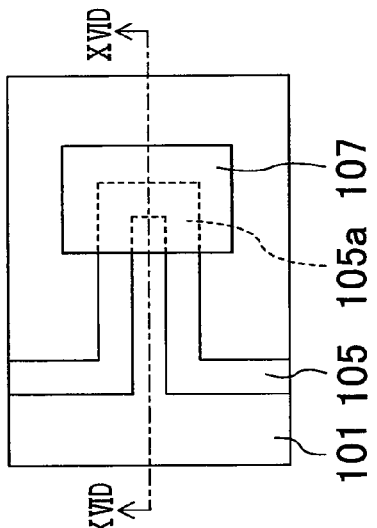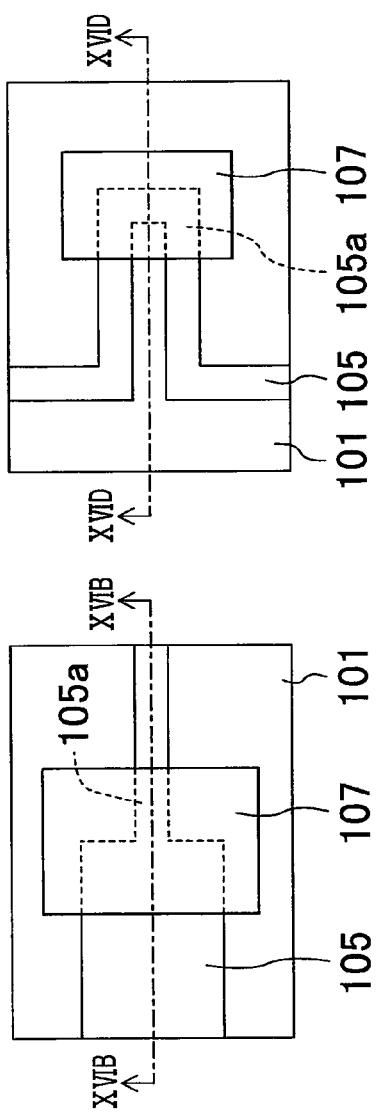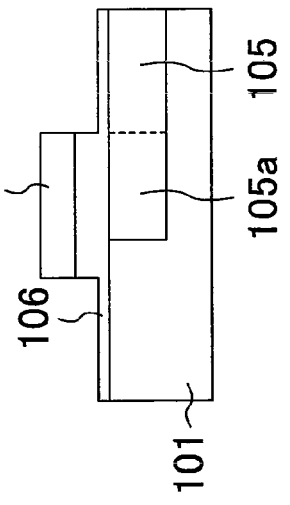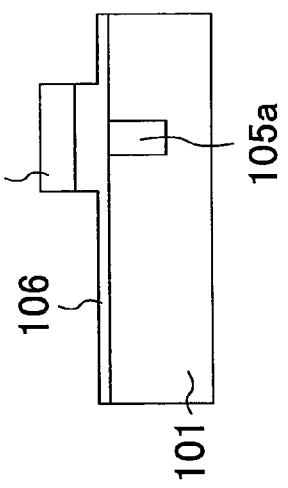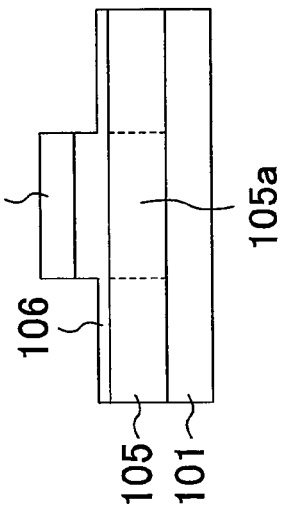

SEMICONDUCTOR DEVICE INCLUDING INTERCONNECTS, VIAS CONNECTING THE INTERCONNECTS AND GREATER THICKNESS OF THE LINER FILM ADJACENT THE VIAS

CROSS REFERENCE TO RELATED APPLICATION

This application claims priority from Japanese Patent Application No. 2008-125135 filed on May 12, 2008, which is hereby incorporated by reference in its entirety for all purposes.

BACKGROUND OF THE INVENTION

The present invention relates to a semiconductor device and a method for fabricating the semiconductor device.

In recent years, with the increasing miniaturization of semiconductor integrated circuit devices, the distance between interconnects that connect semiconductor integrated circuit devices, and the distance between interconnects formed in semiconductor integrated circuit devices have been reduced. Due to this, a problem has emerged in that the capacitance between interconnects increases causing a reduction in signal transmission speed. In light of this, as described in pp. 213-215 in "45 nm Node Multi Level Interconnects with Porous SiOCH Dielectric k=2.5" by V. Arnal et, al. (IITC2006), methods for reducing the capacitance between interconnects by using interlayer insulating films (Low-k films) having low dielectric constants are being studied. The semiconductor device fabrication method described in the above-mentioned document will be discussed below with reference to FIG. 17.

First, as shown in FIG. 17A, an interlayer insulating film 1 is deposited on the surface of a semiconductor substrate (not shown), and then wiring grooves 2 are formed in the interlayer insulating film 1 by photolithography and by dry etching. As the interlayer insulating film 1, an interlayer insulating film having a low dielectric constant, such as a SiOC film, is employed. Thereafter, a barrier film 3 and a Cu film 4 are deposited in this order on the surface of the interlayer insulating film 1 and in the wiring grooves 2. Part of the barrier film 3 and part of the Cu film 4 protruding out from the wiring grooves 2 are then removed by performing a CMP (Chemical Mechanical Polishing) process. Consequently, lower-level interconnects 5 are formed in the wiring grooves 2.

Next, as shown in FIG. 17B, a liner insulating film 6 is deposited on the surfaces of the interlayer insulating film 1 and lower-level interconnects 5, and an interlayer insulating film 7 is deposited on the surface of the liner insulating film 6.

Subsequently, as shown in FIG. 17C, via holes 8a are formed in the liner insulating film 6 and interlayer insulating film 7 by lithography and by dry etching. Thereafter, wiring grooves 9 are formed in the interlayer insulating film 7.

Next, as shown in FIG. 17D, a barrier film 10 and a Cu film 11 are deposited in this order on the surface of the interlayer insulating film 7, in the via holes 8a, and in the wiring grooves 9. Then, part of the barrier film 10 and part of the Cu film 11 protruding out from the wiring grooves 9 are removed by performing a CMP process. Consequently, vias 8 are formed in the via holes 8a, and upper-level interconnects 12 are formed in the wiring grooves 9.

Then, as shown in FIG. 17E, a liner insulating film 13 is deposited on the surfaces of the interlayer insulating film 7 and upper-level interconnects 12, and an interlayer insulating film 14 is deposited on the surface of the liner insulating film 13. Thereafter, the surface of the interlayer insulating film 14 is planarized by performing a CMP process. This process completes the semiconductor device having the two-level interconnection structure shown in FIG. 17E. After that, repeating the process steps shown in FIGS. 17C to 17E also enables fabrication of a semiconductor device having a multilevel interconnection structure of any levels.

SUMMARY OF THE INVENTION

However, the conventional technique has a problem in that the electromigration resistance of interconnects deteriorates. This problem will be discussed below with reference to FIGS. 18A to 19B.

For the sake of simplicity, the problem will be discussed by giving interconnection structures shown in FIGS. 18A to 19B as examples. In FIGS. 18A to 19B, the same members as those shown in FIGS. 17A to 17E are given the same reference numerals, and detailed description thereof will be omitted herein. In FIGS. 18A to 19B, the reference numeral 15 refers to an electron wind, 16 to an anode terminal, and 17 to a cathode terminal.

First, a description will be made of a phenomenon in which an electron wind flowing from a via into a lower-level interconnect results in creation of a void in a part of the surface of the lower-level interconnect that is in contact with the via of the cathode terminal. FIG. 18A shows the initial state of the interconnection structure. As is well known, the above-mentioned electromigration is a phenomenon in which metal atoms forming interconnects move in a direction opposite to a current by using the electron wind 15 as the driving force. Now, a phenomenon occurring in the anode terminal 16 will be discussed. The electron wind 15 causes Cu atoms to move toward the anode terminal 16. However, since the Cu atoms cannot pass through the barrier film 10, compressive stress that affects the Cu film 4 increases with time.

When this compressive stress reaches a critical value, the state shown in FIG. 18B results. Specifically, in the multilayer film structure located around the via 8 of the anode terminal, delamination occurs at the weakest interface (which is often the interface between the interlayer insulating film 1 and the liner insulating film 6), causing a protrusion 20 of the Cu film 4 to be generated in the delaminated area. Since the total number of Cu atoms forming the lower-level interconnect 5 is fixed, the generation of the protrusion 20 causes a void 21 to occur in a part of the lower-level interconnect 5 located in the vicinity of the via 8 of the cathode terminal 17, resulting in disconnection between the lower-level interconnect 5 and the upper-level interconnect 12. In this way, electromigration causes a failure.

Next, a description will be made of a phenomenon in which an electron wind flowing from a lower-level interconnect into a via results in creation of a void in the via of the cathode terminal. FIG. 19A shows the initial state of the interconnection structure. As described above, electromigration is a phenomenon in which metal atoms forming interconnects move in a direction opposite to a current by using the electron wind 15 as the driving force. Now, a phenomenon occurring in the anode terminal 16 will be discussed. The electron wind 15 causes Cu atoms to move toward the anode terminal 16. However, since the Cu atoms cannot pass through the barrier film 10, compressive stress that affects the Cu film 11 increases with time.

When this compressive stress reaches a critical value, the state shown in FIG. 19B results. Specifically, in the multilayer film structure located around the via 8 of the anode terminal, delamination occurs at the weakest interface (which is often the interface between the interlayer insulating film 7 and the liner insulating film 13), causing a protrusion 18 of the Cu film 11 to be generated in the delaminated area. Since the total number of Cu atoms forming the upper-level interconnect 12 is fixed, the generation of the protrusion 18 causes a void 19 to occur in the via 8 of the cathode terminal 17, resulting in disconnection between the lower-level interconnect 5 and the upper-level interconnect 12. In this way, electromigration causes a failure.

Electromigration-caused failures such as described above have been occurring more significantly as low-k films have been introduced. The reason for this is as follows. Low-k films typically have low mechanical strength, and thus easily deform with an increase in compressive stress that affects Cu films. This deformation is likely to cause irreversible failures, such as the delamination between the interlayer insulating film 1 and the liner insulating film 6 shown in FIG. 18B and the delamination between the interlayer insulating film 7 and the liner insulating film 13 shown in FIG. 19B.

Furthermore, semiconductor devices are required to have lower capacitance between interconnects. To satisfy this requirement, it is desirable to form thin liner insulating films.

In an inventive semiconductor device, a first interlayer insulating film is formed on a semiconductor substrate; first interconnects are formed in the first interlayer insulating film; a liner insulating film is formed on the first interlayer insulating film and on the first interconnects; a second interlayer insulating film is formed on the liner insulating film; and second interconnects are formed in the second interlayer insulating film. Also, vias are formed in the liner insulating film and in the second interlayer insulating film, and electrically connects the first and second interconnects. Parts of the liner insulating film formed in via-adjacent regions have a greater thickness than a part thereof formed outside the via-adjacent regions.

This structure increases the effective mechanical strength of the interconnection structures located around the vias, resulting in an increase in electromigration resistance.

Furthermore, the local increase in the thickness of the liner insulating film reduces the capacitance between the interconnects.

In preferred embodiments described later, the liner insulating film is a multilayer film including a first liner insulating film and a second liner insulating film. In those embodiments, the first liner insulating film is not formed outside the via-adjacent regions, and has a Young's modulus of 40 GPa or higher. The second liner insulating film has a dielectric constant of 4.5 or lower. This enables proper adjustment of the balance between increase in electromigration resistance and reduction in the capacitance between the interconnects.

In another preferred embodiment described later, an air gap is formed between at least one of adjacent pairs of the first interconnects. This reduces the capacitance between the interconnects. The air gap is formed in a gap formed between the one of the adjacent pairs of the first interconnects, and the second liner insulating film is formed on the bottom and side walls of the gap. This enables the air gap to be formed without increasing the number of fabrication process steps, allowing the semiconductor device to be fabricated in a simplified manner.

In the inventive semiconductor device, preferably, each of the via-adjacent regions is a region on the upper surface of the first interlayer insulating film, has a length and a width each equal to, or within, two to ten times greater than the diameter of a corresponding one of the vias, and has a center matching the center of the corresponding via. This reduces the capacitance between the interconnects, while effectively increasing electromigration resistance.

In the inventive semiconductor device, the thickness of the parts of the liner insulating film formed in the via-adjacent regions is preferably 10 nm or more and 100 nm or less.

In the inventive semiconductor device, of the part of the liner insulating film formed outside the via-adjacent regions, a part formed on a distance between an adjacent pair of the first interconnects which is 2d or more preferably has a greater thickness than a part formed on a distance between an adjacent pair of the first interconnects which is less than 2d, where d is the value of a smallest distance between adjacent pairs of the first interconnects. As in this case, when the distance between interconnects is sufficiently large, the capacitance between those interconnects does not increase. Thus, it is possible to further increase electromigration resistance by employing the above-described structure.

In this case, when the liner insulating film is a multilayer film including a first liner insulating film and a second liner insulating film, the part of the liner insulating film formed outside the via-adjacent regions is the second liner insulating film.

In the inventive semiconductor device, a first portion, in which one of the first interconnects changes in width, bends, or divides, is preferably present in a part of the upper surface of the first interlayer insulating film located outside the via-adjacent regions, and, of the part of the liner insulating film formed outside the via-adjacent regions, a part formed on the first portion preferably has a greater thickness than a part formed on a portion other than the first portion. Then, even if compressive stress affecting the first interconnects locally increases in the first portion, a decline in electromigration resistance is suppressed.

In this case, when the liner insulating film is a multilayer film including a first liner insulating film and a second liner insulating film, the part of the liner insulating film formed outside the via-adjacent regions is the second liner insulating film.

An inventive method for fabricating a semiconductor device includes the steps of: (a) forming a first interlayer insulating film on a semiconductor substrate; (b) forming first interconnects in the first interlayer insulating film after the step (a) is performed; (c) forming a liner insulating film on the first interlayer insulating film and on the first interconnects after the step (b) is performed; (d) forming a second interlayer insulating film on the liner insulating film after the step (c) is performed; and (e) forming vias in the liner insulating film and in the second interlayer insulating film, and forming second interconnects in the second interlayer insulating film, the vias being electrically connected with the first interconnects, the second interconnects being electrically connected with the vias, after the step (d) is performed. In the step (c), the liner insulating film is formed in such a manner that parts thereof located in via-adjacent regions have a greater thickness than a part thereof located outside the via-adjacent regions, the via-adjacent regions being located around the vias formed in the step (e).

In preferred embodiments described later, in the step (c), a multilayer film including a first liner insulating film and a second liner insulating film is formed as the liner insulating film; and the step (c) includes the steps of (c1) forming the first liner insulating film in the via-adjacent regions, and (c2) forming the second liner insulating film in and outside the via-adjacent regions after the step (c1) is performed.

In another preferred embodiment described later, the semiconductor device fabrication method further includes, between the steps (c1) and (c2), the step (f) of removing a part of the first interlayer insulating film located between an adjacent pair of the first interconnects, thereby forming a gap; and in the step (d), an air gap is formed by covering the gap with the second interlayer insulating film. Furthermore, in the step (c2), the second liner insulating film is preferably also formed on the bottom and side walls of the gap.

In the above-mentioned preferred embodiments described later and in the above-mentioned other preferred embodiment described later, an insulating film having a Young's modulus of 40 GPa or higher is preferably used as the first liner insulating film. Also, in those embodiments, an insulating film having a dielectric constant of 4.5 or lower is preferably used as the second liner insulating film. Moreover, in those embodiments, in the step (c1), after the first liner insulating film is formed on the first interconnects and on the first interlayer insulating film, a part or the first liner insulating film formed outside the via-adjacent regions is preferably removed so that the first interconnects or the first interlayer insulating film is partially exposed. Furthermore, in those embodiments, in the step (c1), the via-adjacent regions are preferably defined on the upper surface of the first interlayer insulating film in such a manner that each of the via-adjacent regions has a length and a width each equal to, or within, two to ten times greater than the diameter of a corresponding one of the vias, and has a center matching the center of the corresponding via.

In the inventive semiconductor device fabrication method, in the step (c), the thickness of the parts of the liner insulating film formed in the via-adjacent regions is preferably 10 nm or more and 100 nm or less.

In the inventive semiconductor device fabrication method, in the step (c), the liner insulating film is preferably formed in such a manner that, of the part thereof located outside the via-adjacent regions, a part located on a distance between an adjacent pair of the first interconnects which is 2d or more has a greater thickness than a part located on a distance between an adjacent pair of the first interconnects which is smaller than 2d, where d is the value of a smallest distance between adjacent pairs of the first interconnects.

In the inventive semiconductor device fabrication method, in the step (b), the first interconnects are preferably formed in such a manner that a first portion, in which one of the first interconnects changes in width, bends, or divides, is present in a part of the upper surface of the first interlayer insulating film located outside the via-adjacent regions; and in the step (c), the liner insulating film is preferably formed in such a manner that, of the part thereof formed outside the via-adjacent regions, a part formed on the first portion has a greater thickness than a part formed on a portion other than the first portion.

BRIEF DESCRIPTION OF THE DRAWINGS

FIGS. 16A, 16C, and 16E are top views illustrating a semiconductor device according to a sixth embodiment of the invention, and FIGS. 16B, 16D, and 16F are cross-sectional views thereof.

DETAILED DESCRIPTION OF THE INVENTION

Figure 1:
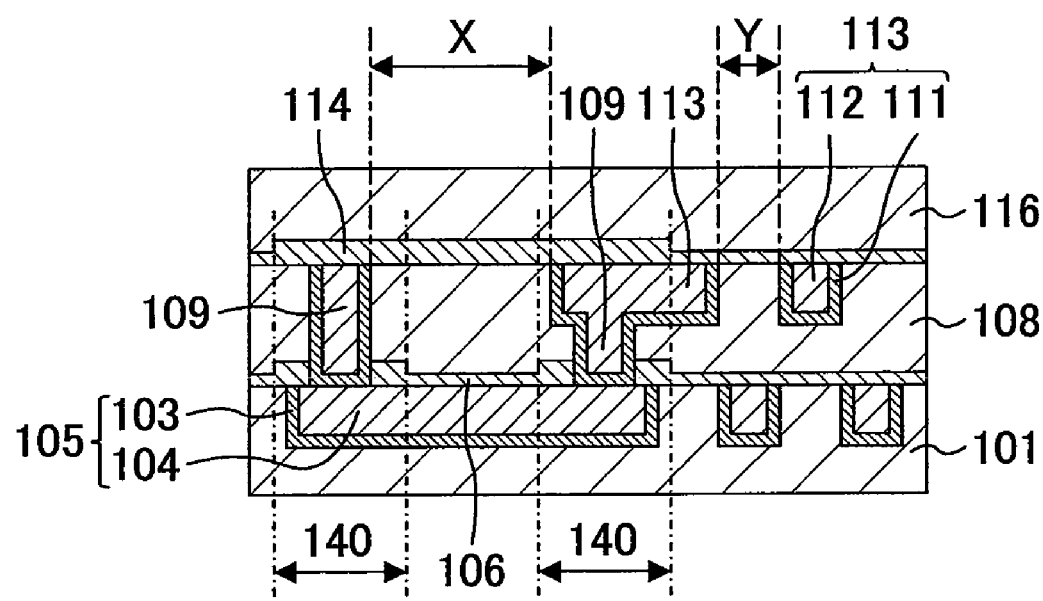
FIG. 1 is a cross-sectional view illustrating a semiconductor device according to a first embodiment of the invention.

Hereinafter, embodiments of the present invention will be described with reference to the accompanying drawings. The present invention is however not limited to the following embodiments. It should be noted that the same members are identified by the same reference numerals, and the description thereof may be omitted herein.

First Embodiment

A semiconductor device according to a first embodiment of the present invention will be described with reference to FIG. 1. It is to be understood that materials and numerical values cited below are only preferable examples, and the present invention is not limited to these materials and numerical values.

As shown in FIG. 1, lower-level interconnects 105 (first interconnects) are formed in an interlayer insulating film 101 (a first interlayer insulating film) formed on a semiconductor substrate (not shown). A liner insulating film 106 is formed on the interlayer insulating film 101 and lower-level interconnects 105. On the liner insulating film 106, an interlayer insulating film 108 (a second interlayer insulating film) is formed. Vias 109, which are electrically connected with the lower-level interconnects 105, are formed in the liner insulating film 106 and interlayer insulating film 108. In the interlayer insulating film 108, upper-level interconnects 113 (second interconnects), which are electrically connected with the vias 109, are formed. A liner insulating film 114 is formed on the interlayer insulating film 108 and upper-level interconnects 113. On the liner insulating film 114, an interlayer insulating film 116 is formed.

In this semiconductor device, the interlayer insulating films 101, 108, and 116 are preferably insulating films having a low dielectric constant, such as SiOC films. The use of low-dielectric-constant films reduces the capacitance between the interconnects. The liner insulating films 106 and 114 are preferably insulating films, such as SiCN films, that have higher mechanical strength than the interlayer insulating films 101 and 108. The use of films of high mechanical strength prevents Cu atoms in Cu films 104 in the lower-level interconnects 105 from diffusing into the interlayer insulating film 108, while enabling electromigration resistance to increase. The lower-level interconnects 105 are each composed of a barrier metal film 103 and a conductive film made of a Cu film 104 or the like. The barrier metal film 103 is formed as the outer part of each lower-level interconnect 105 by a known method, and the conductive film is formed as the inner part. The upper-level interconnects 113 and the vias 109 are each composed of a barrier metal film 111 and a conductive film made of a Cu film 112 or the like. The barrier metal film 111 is formed as the outer part of each of the upper-level interconnects 113 and vias 109 by a known method, and the conductive film is formed as the inner part.

The thickness of the liner insulating film 106 differs between via-adjacent regions 140, and an area outside the via-adjacent regions 140. That is, as shown in FIG. 1, around the lower ends of the vias 109, the parts of the liner insulating film 106 located in the via-adjacent regions 140 have a greater thickness than the part thereof located outside the via-adjacent regions 140. Specifically, around the lower ends of the vias 109, the parts of the liner insulating film 106 located in the via-adjacent regions 140 have a thickness of 20 nm, while the part thereof located outside the via-adjacent regions 140 has a thickness of 10 nm. It should be noted that these thicknesses are provided only as examples. This local increase in the thickness of the liner insulating film 106 in the via-adjacent regions 140 around the lower ends of the vias 109 produces the effect of increasing resistance to electromigration occurring when a current flows from the vias 109 into the lower-level interconnects 105. To be specific, the liner insulating film 106 has higher mechanical strength than the interlayer insulating film 101 located around the lower ends of the vias 109. Thus, increasing the thickness of the parts of the liner insulating film 106 located in the via-adjacent regions 140 around the lower ends of the vias 109 increases the effective mechanical strength of the interconnection structures located around the vias 109. Consequently, a phenomenon in which an increase in compressive stress affecting the Cu films 104 in the lower-level interconnects 105, caused by such electromigration, results in deformation of the interconnection structures located around the vias 109 is less likely to occur, thereby suppressing delamination at the interface between the interlayer insulating film 101 and the liner insulating film 106. This increases the resistance to such electromigration.

As in the liner insulating film 106, the thickness of the liner insulating film 114 differs between the via-adjacent regions 140, and an area outside the via-adjacent regions 140. That is, as shown in FIG. 1, on or over the vias 109, the parts of the liner insulating film 114 located in the via-adjacent regions 140 have a greater thickness than part thereof located outside the via-adjacent regions 140. This local increase in the thickness of the liner insulating film 114 in the via-adjacent regions 140 on or over the vias 109, as in the case of the local increase in the thickness of the liner insulating film 106 in the via-adjacent regions 140 around the lower ends of the vias 109, increases the effective mechanical strength of the interconnection structures located around the vias 109, thereby producing the effect of increasing resistance to electromigration occurring when a current flows from the vias 109 into the lower-level interconnects 105. In addition, for the same reason as described above, this local increase in the thickness of the liner insulating film 114 also produces the effect of increasing resistance to electromigration occurring when a current flows from the vias 109 into the upper-level interconnects 113.

In this embodiment, the via-adjacent regions 140 are regions on the upper surfaces of the interlayer insulating films 101 and 108, whose length and width are equal to, or within, two to ten times greater than the diameter of a corresponding via and whose center matches the center of the corresponding via. If the length and width of the via-adjacent regions 140 on the upper surfaces of the interlayer insulating films 101 and 108 are smaller than two times the via diameter, it is difficult to increase the effective mechanical strength of the interconnection structures located around the vias 109, and thus electromigration resistance cannot be increased sufficiently. It is therefore not preferable for the via-adjacent regions 140 to have a length and width smaller than two times the via diameter. In other words, the via-adjacent regions 140 are regions where delamination between the interlayer insulating film 101 and the liner insulating film 106 is expected to occur and where delamination between the interlayer insulating film 108 and the liner insulating film 114 is expected to occur when compressive stress that affects the Cu films 104 and 112 increases due to electromigration.

On the other hand, if the length and width of the via-adjacent regions 140 on the upper surfaces of the interlayer insulating films 101 and 108 are greater than ten times the via diameter, the capacitance between the interconnects cannot be reduced sufficiently. It is thus not preferable for the via-adjacent regions 140 to have a length and width greater than ten times the via diameter. Therefore, this upper limit value may be set with consideration given to the materials of the interlayer insulating films and to the distance between the interconnects in the semiconductor device.

The respective thicknesses of the parts of the liner insulating films 106 and 114 located in the via-adjacent regions 140 may be equal to, or within, two to ten times greater than the respective thicknesses of their parts located outside the via-adjacent regions 140, and thus may be 10 nm or more and 100 nm or less. It is not preferable for the parts of the liner insulating films 106 and 114 located in the via-adjacent regions 140 to have substantially the same thicknesses as the respective parts thereof located outside the via-adjacent regions 140, because electromigration resistance cannot be increased sufficiently. On the other hand, if the thicknesses of the parts of the liner insulating films 106 and 114 located in the via-adjacent regions 140 are greater than ten times the thicknesses of the respective parts thereof located outside the via-adjacent regions 140, the parts of the liner insulating films 106 and 114 in the via-adjacent regions 140 are deposited to an unnecessarily large thickness, leading to an increase in the semiconductor device fabrication cost. Furthermore, in that case, large steps are formed on the surfaces of the liner insulating films 106 and 114, and thus the steps remain on the surface of the interlayer insulating film 108 even after a CMP process, thereby making the semiconductor device fabrication difficult.

The term "regions around the vias 109" herein means three-dimensional regions.

In this embodiment, when the distance between adjacent upper-level interconnects 113 and 113 outside the via-adjacent regions 140 is large, the thickness of the liner insulating film 114 on or over the vias 109 may be increased where the liner insulating film 114 is located between these upper-level interconnects 113 and 113 as well as where the liner insulating film 114 is located in the via-adjacent regions 140, as compared to where the liner insulating film 114 is located on the spaces between adjacent upper-level interconnects 113 and 113 which are located outside the via-adjacent regions 140 and which are not so large. As shown in FIG. 1, the interconnect distance X is larger than the interconnect distance Y. In this case, although the region in which the interconnect distance is X is located outside the via-adjacent regions 140, the liner insulating film 114 may be formed so as to have a greater thickness in that region than in other regions (for example, the region in which the interconnect distance is Y) located outside the via-adjacent regions 140. The reason for this is as follows. When the distance between upper-level interconnects 113 and 113 is large, the capacitance between these interconnects does not increase very much, and thus does not need to be reduced. In this case, it is therefore advantageous to ensure the mechanical strength of the entire semiconductor device rather than to reduce the thickness of the liner insulating film 114 to lower the capacitance between these interconnects. In this embodiment, the case in which the distance between interconnects is large means a case in which that distance is equal to or greater than twice the value of the smallest distance between interconnects in the semiconductor device. This also applies to the liner insulating film 106.

Next, a method for fabricating the semiconductor device according to the first embodiment of the present invention will be described with reference to FIGS. 2A to 4C. It should be noted that materials and numerical values cited below are only preferable examples, and the present invention is not limited to these materials and numerical values.

Figure 2A:
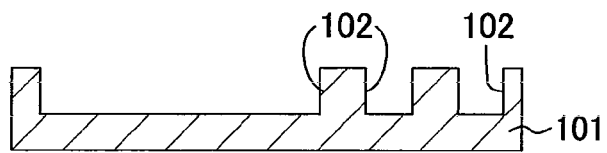
FIGS. 2A to 2F are cross-sectional views illustrating process steps in a method for fabricating the semiconductor device according to the first embodiment of the invention.

First, as shown in FIG. 2A, after the interlayer insulating film 101 is deposited on the surface of a semiconductor substrate (not shown) (step (a)), the wiring grooves 102 are formed in the interlayer insulating film 101 by photolithography and by dry etching. As the interlayer insulating film 101, an insulating film having a low dielectric constant, such as a SiOC film, is preferably employed.

Figure 2B:
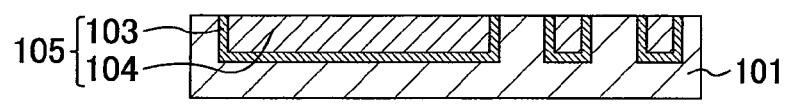

Next, as shown in FIG. 2B, the barrier metal film 103 and the Cu film 104 are deposited in this order on the surface of the interlayer insulating film 101 and in the wiring grooves 102. Then, part of the barrier metal film 103 and part of the Cu film 104 protruding out from the wiring grooves 2 are removed by performing a CMP process. Consequently, the lower-level interconnects 105 are formed in the wiring grooves 2 (step (D)).

Figure 2C:
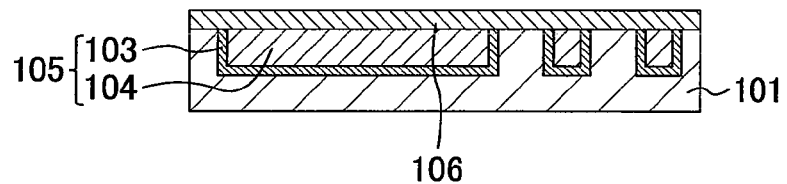

Subsequently, as shown in FIG. 2C, the liner insulating film 106 is deposited on the surfaces of the interlayer insulating film 101 and lower-level interconnects 105 (step (c)). In this embodiment, a SiCN film having a thickness of 20 nm is employed as the liner insulating film 106.

Figure 2D:
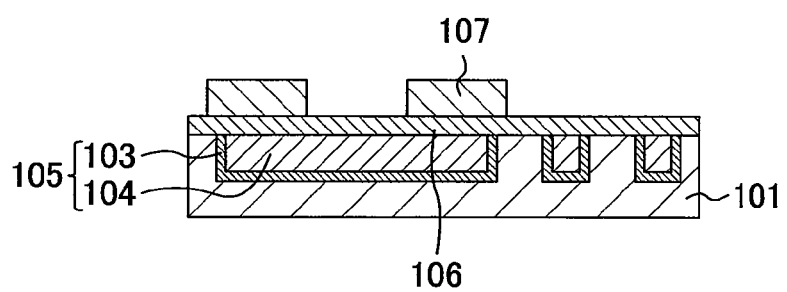

Then, as shown in FIG. 2D, a resist pattern 107 is formed on parts of the surface of the liner insulating film 106 by lithography. Although a forthcoming fourth embodiment will describe the preferable location of the resist pattern 107 on the surface of the liner insulating film 106, the resist pattern 107 is formed at least around the regions where the vias 109 are to be formed (i.e., in the via-adjacent regions 140).

Figure 2E:
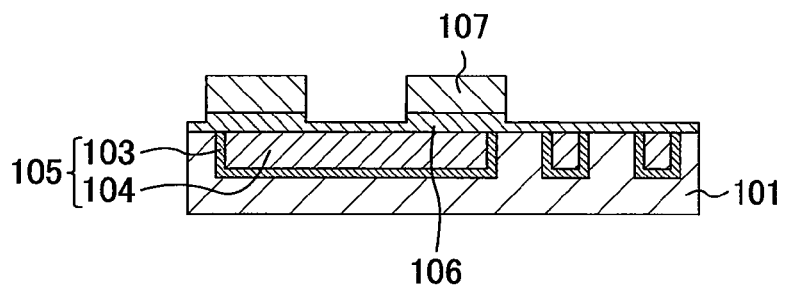

Next, as shown in FIG. 2E, the liner insulating film 106 is partially etched with the resist pattern 107 used as a mask. In this embodiment, the amount of etching of the liner insulating film 106 is set to 10 nm. Due to this setting, the thickness of the parts of the liner insulating film 106 covered with the resist pattern 107 does not change, while the parts thereof that are not covered with the resist pattern 107 are etched to a thickness of 10 nm. In other words, the liner insulating film 106 is formed in such a manner that the parts thereof located around the regions where the vias 109 are to be formed are thicker than the other parts thereof.

Figure 2F:
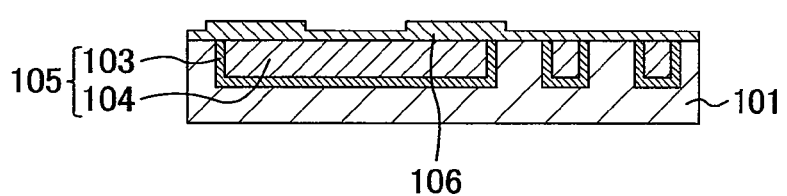

Then, as shown in FIG. 2F, the resist pattern 107 is removed.

Figure 3A:
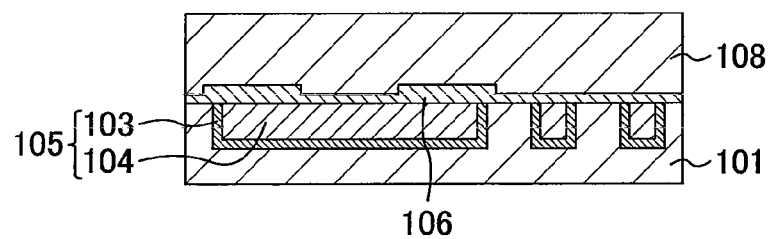
FIGS. 3A to 3E are cross-sectional views illustrating process steps in the method for fabricating the semiconductor device according to the first embodiment of the invention.

Next, as shown in FIG. 3A, after the interlayer insulating film 108 is deposited on the surface of the liner insulating film 106 (step (d)), the surface of the interlayer insulating film 108 is planarized by performing a CMP process.

Figure 3B:
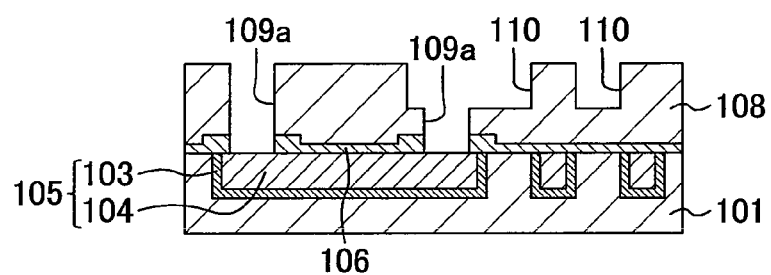

Subsequently, as shown in FIG. 3B, the via holes 109a are formed in the liner insulating film 106 and interlayer insulating film 108 by lithography and by dry etching, and the wiring grooves 110 are formed in the interlayer insulating film 108. In this process step, the via holes 109a are formed so as to pass through the liner insulating film 106 and the interlayer insulating film 108, while the wiring grooves 110 are formed so as not to pass through the interlayer insulating film 108.

Figure 3C:
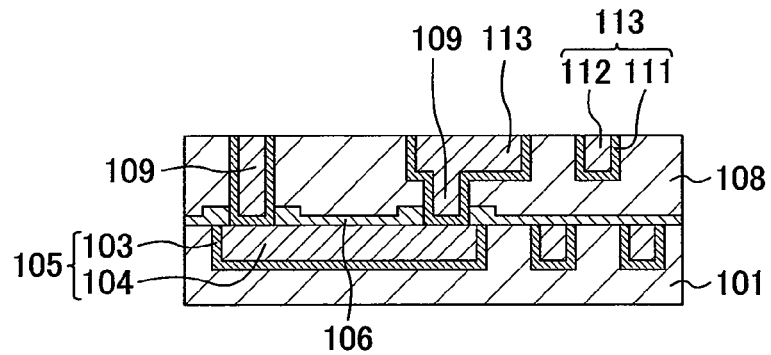

Then, as shown in FIG. 3C, the barrier metal film 111 and the Cu film 112 are deposited in this order on the surface of the interlayer insulating film 108, in the via holes 109a, and in the wiring grooves 110. Then, part of the barrier metal film 111 and part of the Cu film 112 protruding out from the wiring grooves 110 are removed by performing a CMP process. Consequently, the vias 109 are formed in the via holes 109a, and the upper-level interconnects 113 are formed in the wiring grooves 110 (step (e)).

Figure 3D:
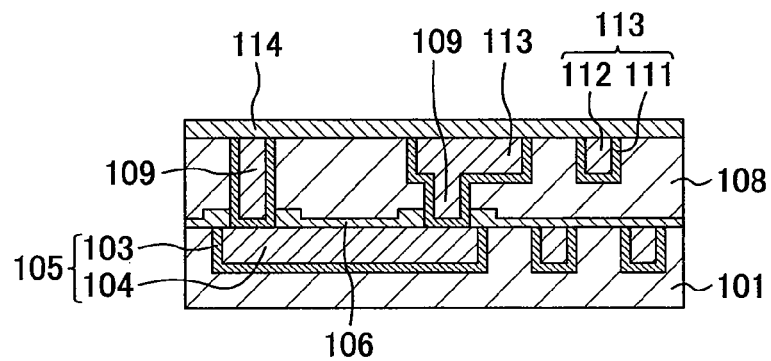

Next, as shown in FIG. 3D, the liner insulating film 114 is deposited on the surfaces of the interlayer insulating film 108 and upper-level interconnects 113. In this embodiment, a SiCN film having a thickness of 20 nm is employed as the liner insulating film 114.

Figure 3E:
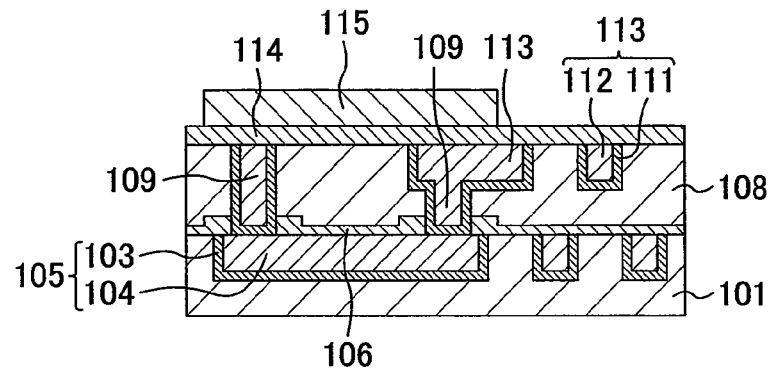

Then, as shown in FIG. 3E, a resist pattern 115 is formed on parts of the surface of the liner insulating film 114 by lithography. Although the forthcoming fourth embodiment will describe the preferable location of the resist pattern 115 on the surface of the liner insulating film 114, the resist pattern 115 is formed at least around the regions where the vias 109 have been formed.

Figure 4A:
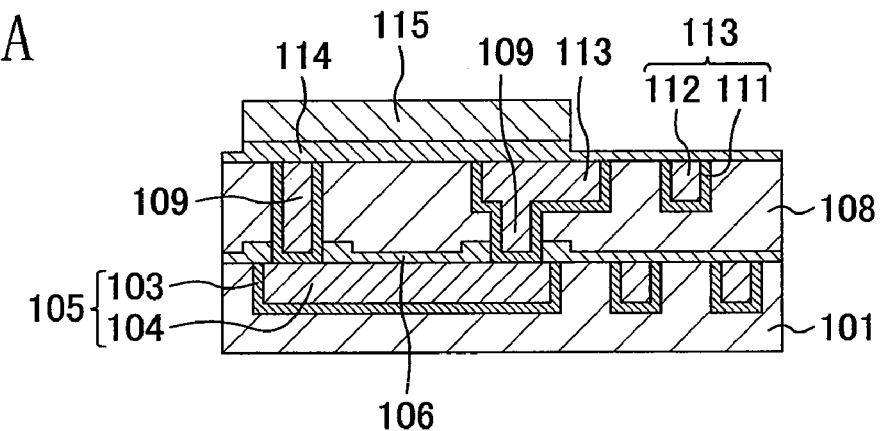
FIGS. 4A to 4C are cross-sectional views illustrating process steps in the method for fabricating the semiconductor device according to the first embodiment of the invention.

Next, as shown in FIG. 4A, the liner insulating film 114 is partially etched with the resist pattern 115 used as a mask. In this embodiment, the amount of etching of the liner insulating film 114 is set to 10 nm. Due to this setting, the thickness of the parts of the liner insulating film 114 covered with the resist pattern 115 does not change, while the parts thereof that are not covered with the resist pattern 115 are etched to a thickness of 10 nm. In other words, the liner insulating film 114 is formed in such a manner that the parts thereof located around the regions where the vias 109 have been formed are thicker than the other parts thereof.

Figure 4B:
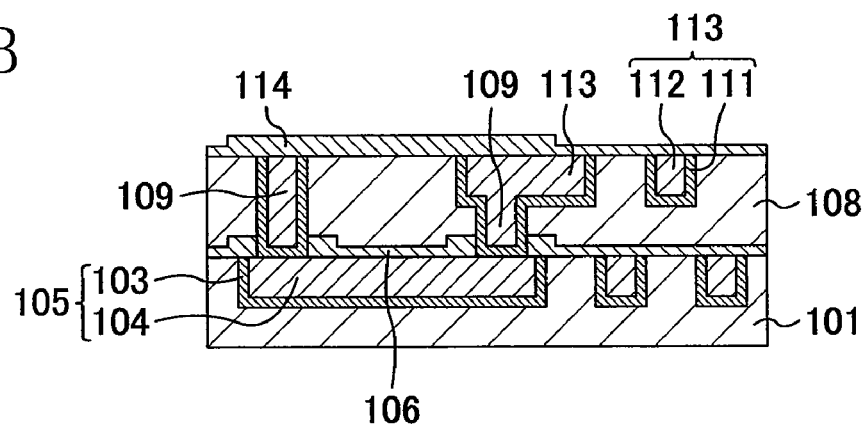

Then, as shown in FIG. 4B, the resist pattern 115 is removed.

Lastly, the interlayer insulating film 116 is deposited on the surface of the liner insulating film 114. Then, the surface of the interlayer insulating film 116 is planarized by performing a CMP process. This process completes the semiconductor device having the two-level interconnection structure shown in FIG. 4C. After that, repeating the process steps shown in FIGS. 3B to 4C also enables fabrication of a semiconductor device having a multilevel interconnection structure of any levels.

Figure 4C:
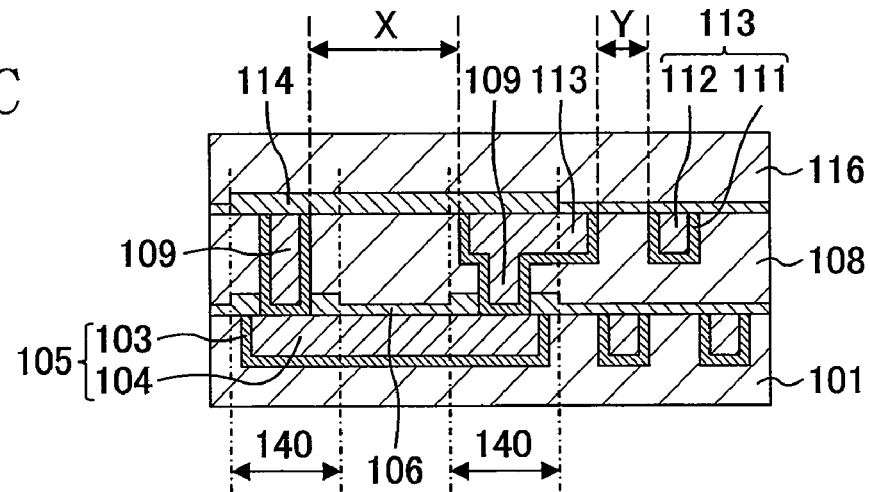

The two-level interconnection structure shown in FIG. 4C is characterized in that:

(1) around the lower ends of the vias 109, the thickness of the liner insulating film 106 is locally increased in the via-adjacent regions 140, and (2) on or over the vias 109, the thickness of the liner insulating film 114 is locally increased in the via-adjacent regions 140.

Characteristic (1) increases resistance to electromigration occurring when a current flows from the vias 109 into the lower-level interconnects 105. The reason for this is as follows. The liner insulating film 106 has higher mechanical strength than another insulating film (the interlayer insulating film 101) located around the lower ends of the vias 109. Thus, increasing the thickness of the parts of the liner insulating film 106 located in the via-adjacent regions 140 increases the effective mechanical strength of the interconnection structures located around the vias 109. Consequently, a phenomenon in which an increase in compressive stress affecting the Cu films 104, caused by such electromigration, results in deformation of the structures located around the vias 109 is less likely to occur. Hence, delamination between the interlayer insulating film 101 and the liner insulating film 106 is suppressed, thereby increasing the resistance to such electromigration.

Characteristic (2) further increases the resistance to electromigration occurring when a current flows from the vias 109 into the lower-level interconnects 105. The reason for this is as follows. The liner insulating film 114 has higher mechanical strength than another insulating film (the interlayer insulating film 108) located around the vias 109. Thus, increasing the thickness of the parts of the liner insulating film 114 located in the via-adjacent regions 140 increases the effective mechanical strength of the interconnection structures located around the vias 109. Consequently, a phenomenon in which an increase in compressive stress affecting the Cu films 104, caused by such electromigration, results in deformation of the structures located around the vias 109 is less likely to occur. Hence, delamination between the interlayer insulating film 108 and the liner insulating film 114 is suppressed, thereby increasing the resistance to such electromigration. In addition, for the same reason as described above, characteristic (2) produces the effect of increasing resistance to electromigration occurring when a current flows from the vias 109 into the upper-level interconnects 113.

As described above, in this embodiment, the parts of the liner insulating films 106 and 114 located in the via-adjacent regions 140 are thicker than the respective parts thereof located outside the via-adjacent regions 140. It is thus possible to increase the effective mechanical strength of the interconnection structures located around the vias 109, resulting in an increase in electromigration resistance. Moreover, this local increase in the thicknesses of the liner insulating films 106 and 114 reduces the capacitance between the interconnects.

Second Embodiment

A semiconductor device according to a second embodiment of the present invention will be described with reference to FIG. 5. It should be noted that materials and numerical values cited below are only preferable examples, and the present invention is not limited to these materials and numerical values.

In the semiconductor device according to this embodiment, liner insulating films 141 and 142 are multilayer films. In the following description, differences from the first embodiment will be mainly discussed.

Figure 5:
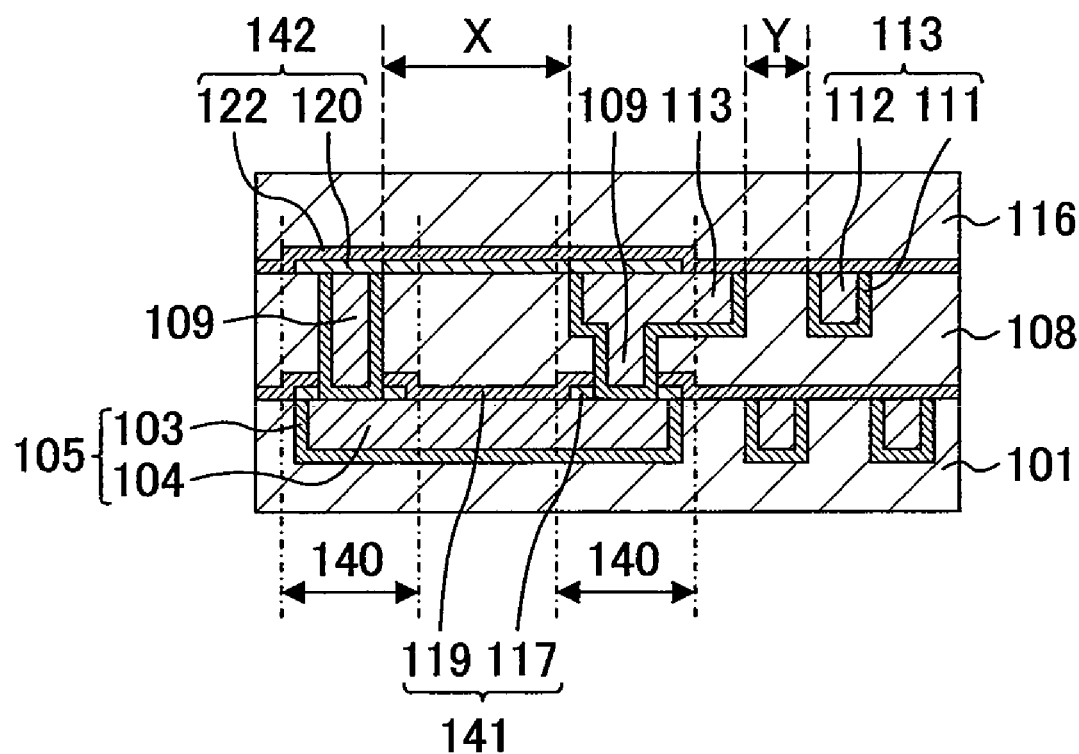
FIG. 5 is a cross-sectional view illustrating a semiconductor device according to a second embodiment of the invention.

As shown in FIG. 5, lower-level interconnects 105 are formed in an interlayer insulating film 101 formed on a semiconductor substrate (not shown). A first liner insulating film 117 is formed on the interlayer insulating film 101 and lower-level interconnect 105. A second liner insulating film 119 is formed over the first liner insulating film 117. The first and second liner insulating films 117 and 119 form the liner insulating film 141. On the second liner insulating film 119, an interlayer insulating film 108 is formed. Vias 109, which are electrically connected with the lower-level interconnects 105, are formed in the first liner insulating film 117, second liner insulating film 119, and interlayer insulating film 108. In the interlayer insulating film 108, upper-level interconnects 113, which are electrically connected with the vias 109, are formed. A third liner insulating film 120 is formed on the interlayer insulating film 108 and upper-level interconnects 113. A fourth liner insulating film 122 is formed over the third liner insulating film 120. The third and fourth liner insulating films 120 and 122 form the liner insulating film 142. An interlayer insulating film 116 is formed on the fourth liner insulating film 122.

The interlayer insulating films 101, 108 and 116 are preferably insulating films having a low dielectric constant, such as SiOC films. The use of low-dielectric-constant films reduces the capacitance between the interconnects. As the first and third liner insulating films 117 and 120, insulating films having high mechanical strength are preferably employed from the viewpoint of preventing diffusion of Cu atoms in Cu films 104 in the lower-level interconnects 105 into the interlayer insulating film 108, and ensuring electromigration resistance; insulating films made of SiCN films, for example, are preferably employed. As the second and fourth liner insulating films 119 and 122, insulating films having a lower dielectric constant than the first and third liner insulating films 117 and 120 are preferably employed from the viewpoint of reducing the capacitance between the interconnects; insulating films made of SiC films, for example, are preferably employed. The lower-level interconnects 105 are each composed of a barrier metal film 103 and a conductive film made of a Cu film 104 or the like. The barrier metal film 103 is formed as the outer part of each lower-level interconnect 105 by a known method, and the conductive film is formed as the inner part. The upper-level interconnects 113 and the vias 109 are each composed of a barrier metal film 111 and a conductive film made of a Cu film 112 or the like. The barrier metal film 111 is formed as the outer part of each of the upper-level interconnects 113 and vias 109 by a known method, and the conductive film is formed as the inner part.

As in the first embodiment, the thickness of the liner insulating film 141 composed of the first and second liner insulating films 117 and 119 differs between via-adjacent regions 140, and an area outside the via-adjacent regions 140. That is, as shown in FIG. 5, around the lower ends of the vias 109, the parts of the liner insulating film 141 located in the via-adjacent regions 140 have a greater thickness than the part thereof located outside the via-adjacent regions 140. Specifically, around the lower ends of the vias 109, the parts of the liner insulating film 141 located in the via-adjacent regions 140 have a thickness of 20 nm, while the part thereof located outside the via-adjacent regions 140 has a thickness of 10 nm. It should be noted that these thicknesses are provided only as examples. This local increase in the thickness of the liner insulating film 141 in the via-adjacent regions 140 around the lower ends of the vias 109 produces the effect of increasing resistance to electromigration occurring when a current flows from the vias 109 into the lower-level interconnects 105. To be specific, the liner insulating film 141 has higher mechanical strength than the interlayer insulating film 101 located around the lower ends of the vias 109. Thus, increasing the thickness of the parts of the liner insulating film 141 located in the via-adjacent regions 140 around the lower ends of the vias 109 increases the effective mechanical strength of the interconnection structures located around the vias 109. Consequently, a phenomenon in which an increase in compressive stress affecting the Cu films 104 in the lower-level interconnects 105, caused by such electromigration, results in deformation of the interconnection structures located around the vias 109 is less likely to occur, thereby suppressing delamination at the interface between the interlayer insulating film 101 and the liner insulating film 141. Thus, the resistance to such electromigration increases.

As in the liner insulating film 141, the thickness of the liner insulating film 142 composed of the third and fourth liner insulating films 120 and 122 differs between the via-adjacent regions 140, and an area outside the via-adjacent regions 140. That is, as shown in FIG. 5, on or over the vias 109, the parts of the liner insulating film 142 located in the via-adjacent regions 140 have a greater thickness than part thereof located outside the via-adjacent regions 140. This local increase in the thickness of the liner insulating film 142 in the via-adjacent regions 140 on or over the vias 109, as in the case of the local increase in the thickness of the liner insulating film 141 in the via-adjacent regions 140 around the lower ends of the vias 109, increases the effective mechanical strength of the interconnection structures located around the vias 109, thereby producing the effect of increasing resistance to electromigration occurring when a current flows from the vias 109 into the lower-level interconnects 105. In addition, for the same reason as described above, this local increase in the thickness of the liner insulating film 142 also produces the effect of increasing resistance to electromigration occurring when a current flows from the vias 109 into the upper-level interconnects 113.

In this embodiment as in the first embodiment, the via-adjacent regions 140 are regions on the upper surfaces of the interlayer insulating films 101 and 108, whose length and width are equal to, or within, two to ten times greater than the diameter of a corresponding via and whose center matches the center of the corresponding via.

In this embodiment, as described above, the liner insulating film 141 is composed of the first liner insulating film 117 having high mechanical strength and the second liner insulating film 119 having a low dielectric constant, and the liner insulating film 142 is composed of the third liner insulating film 120 having high mechanical strength and the fourth liner insulating film 122 having a low dielectric constant. Therefore, around the lower ends of the vias 109, the first liner insulating film 117 may be formed only in the via-adjacent regions 140, and the second liner insulating film 119 may be formed on the entire upper surfaces of the interlayer insulating film 101 and lower-level interconnects 105. Likewise, on or over the vias 109, the third liner insulating film 120 may be formed only in the via-adjacent regions 140, and the fourth liner insulating film 122 may be formed on the entire upper surfaces of the interlayer insulating film 108 and upper-level interconnects 113. This reduces the capacitance between the interconnects, while increasing electromigration resistance.

The relations between the thicknesses of the respective parts of the liner insulating films 141 and 142 located in the via-adjacent regions 140 and the thicknesses of the respective parts thereof located outside the via-adjacent regions 140 are the same as those in the first embodiment. However, in this embodiment, around the lower ends of the vias 109, the first and second liner insulating films 117 and 119 are stacked in the via-adjacent regions 140, and only the second liner insulating film 119 is formed outside the via-adjacent regions 140. Thus the thickness of the first liner insulating film 117 may be equal to, or within, one to nine times greater than the thickness of the second liner insulating film 119, and may be 5 nm or more and 55 nm or less. Likewise, on or over the vias 109, the third and fourth liner insulating films 120 and 122 are stacked in the via-adjacent regions 140, and only the fourth liner insulating film 122 is formed outside the via-adjacent regions 140. Thus the thickness of the third liner insulating film 120 may be equal to, or within, one to nine times greater than the thickness of the fourth liner insulating film 122, and may be 5 nm or more and 55 nm or less.

In this embodiment, when the distance between adjacent upper-level interconnects 113 and 113 outside the via-adjacent regions 140 is large, the thickness of the part of the liner insulating film 142 formed between these upper-level interconnects 113 and 113, as like the parts thereof located in the via-adjacent regions 140, may be increased as compared to the parts thereof formed on the spaces between upper-level interconnects 113 and 113 which are located outside the via-adjacent regions 140 and which are not so large. As shown in FIG. 5, the interconnect distance X is larger than the interconnect distance Y. In this case, although the region in which the interconnect distance is X is located outside the via-adjacent regions 140, the liner insulating film 142 may have a greater thickness in that region than in other regions located outside the via-adjacent regions 140. To that end, in this embodiment, outside the via-adjacent regions 140, the third liner insulating film 120 may also be formed in the region in which the interconnect distance is X. The reason for this is as follows. When the distance between interconnects is large, the capacitance between these interconnects does not increase very much, and thus does not need to be reduced. In that case, it is therefore advantageous to ensure the mechanical strength of the entire semiconductor device rather than to reduce the thickness of the liner insulating film 142 to lower the capacitance between these interconnects. In this embodiment, the case in which the distance between interconnects is large means a case in which that distance is equal to or greater than twice the value of the smallest distance between interconnects in the semiconductor device. This also applies to the liner insulating film 141.

In FIG. 5, the first and third liner insulating films 117 and 120 are not formed outside the via-adjacent regions 140 and in the region where the distance between the interconnects is small. However, the first and third liner insulating films 117 and 120 may be formed in those regions. With consideration given to a balance of reducing the capacitance between the interconnects and ensuring the mechanical strength of the entire chip, the thicknesses of the first and second liner insulating films 117 and 119 in the liner insulating film 141, and the thicknesses of the third and fourth liner insulating films 120 and 122 in the liner insulating film 142 may be changed. Nevertheless, considering increase in the mechanical strength around the vias 109 and reduction in the capacitance between the interconnects, the first and third liner insulating films 117 and 120 are preferably not formed outside the via-adjacent regions 140 and in regions where the distances between interconnects are small as shown in FIG. 5.

Next, a method for fabricating the semiconductor device according to the second embodiment of the present invention will be described with reference to FIGS. 6A to 8D. It should be noted that materials and numerical values cited below are only preferable examples, and the present invention is not limited to these materials and numerical values.

Figure 6A:
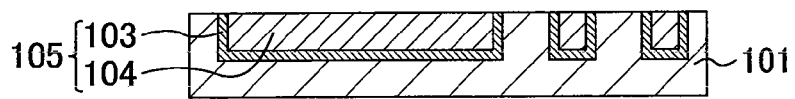
FIGS. 6A to 6F are cross-sectional views illustrating process steps in a method for fabricating the semiconductor device according to the second embodiment of the invention.

First, as shown in FIG. 6A, the lower-level interconnects 105 are formed in the interlayer insulating film 101. The lower-level interconnects 105 are formed in the same manner as in the semiconductor device fabrication method of the first embodiment, and the description thereof will be thus omitted herein.

Figure 6B:
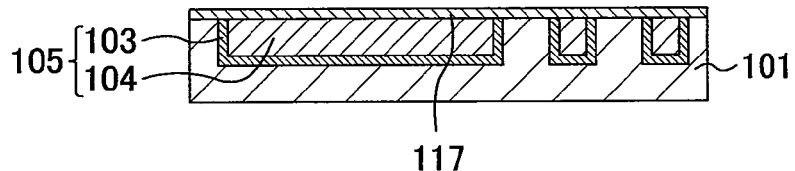

Next, as shown in FIG. 6B, the first liner insulating film 117 is deposited on the surfaces of the interlayer insulating film 101 and lower-level interconnects 105. In this embodiment, a SiCN film having a thickness of 10 nm is employed as the first liner insulating film 117.

Figure 6C:
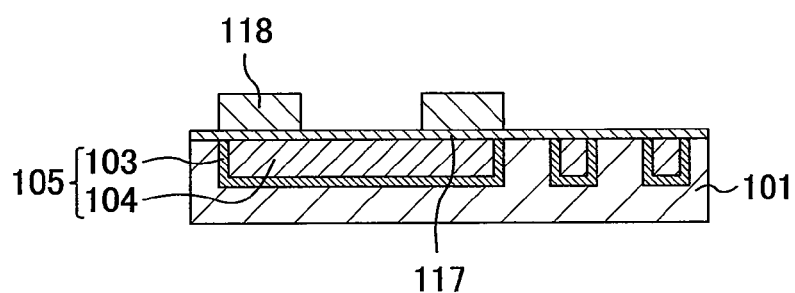

Subsequently, as shown in FIG. 6C, a resist pattern 118 is formed on parts of the surface of the first liner insulating film 117 by lithography. Although the forthcoming fourth embodiment will describe the preferable location of the resist pattern 118 on the surface of the first liner insulating film 117, the resist pattern 118 is formed at least around the regions where the vias 109 are to be formed.

Figure 6D:
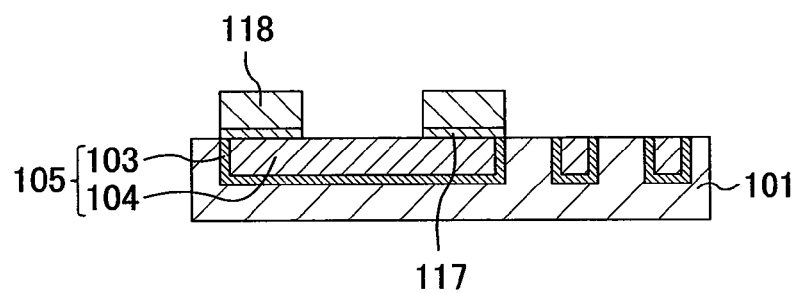

Next, as shown in FIG. 6D, the first liner insulating film 117 is etched with the resist pattern 118 used as a mask, thereby removing the parts of the first liner insulating film 117 that are not covered with the resist pattern 118. Consequently, the first liner insulating film 117 is formed only around the regions where the vias 109 are to be formed (step (c1)), and the parts of the interlayer insulating film 101 and the parts of the lower-level interconnects 105 that are not masked with the resist pattern 118 are exposed.

Figure 6E:
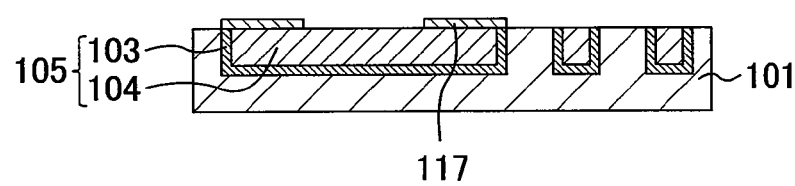

Then, as shown in FIG. 6E, the resist pattern 118 is removed.

Figure 6F:
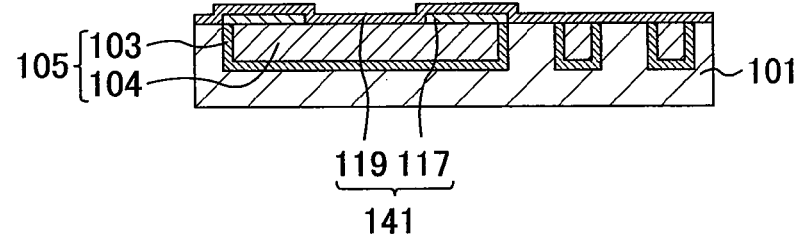

Next, as shown in FIG. 6F, the second liner insulating film 119 is deposited on the surfaces of the interlayer insulating film 101, lower-level interconnects 105, and first liner insulating film 117 (step (c2)). In this embodiment, a SiC film having a thickness of 10 nm is employed as the second liner insulating film 119. This process results in the formation of the liner insulating film 141 composed of the first and second liner insulating films 117 and 119 on the interlayer insulating film 101 and lower-level interconnects 105.

Figure 7A:
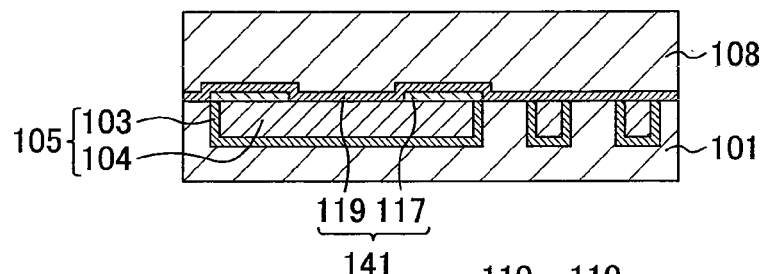
FIGS. 7A to 7E are cross-sectional views illustrating process steps in the method for fabricating the semiconductor device according to the second embodiment of the invention.

Subsequently, as shown in FIG. 7A, the interlayer insulating film 108 is deposited on the surface of the second liner insulating film 119 (step (d)). Then, the surface of the interlayer insulating film 108 is planarized by performing a CMP process.

Figure 7B:
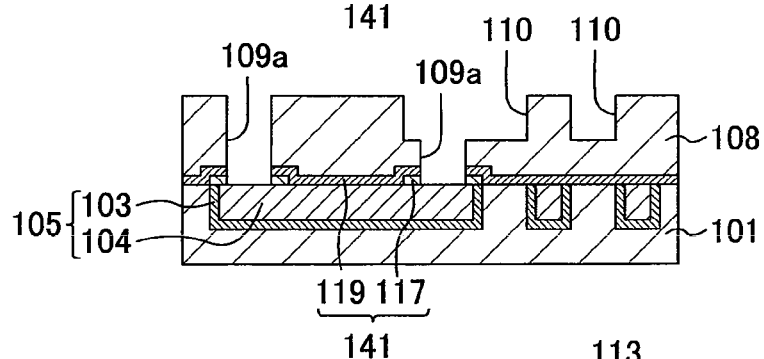

Next, as shown in FIG. 7B, the via holes 109a are formed in the first liner insulating film 117, second liner insulating film 119, and interlayer insulating film 108 by lithography and by dry etching, and the wiring grooves 110 are formed in the interlayer insulating film 108.

Figure 7C:
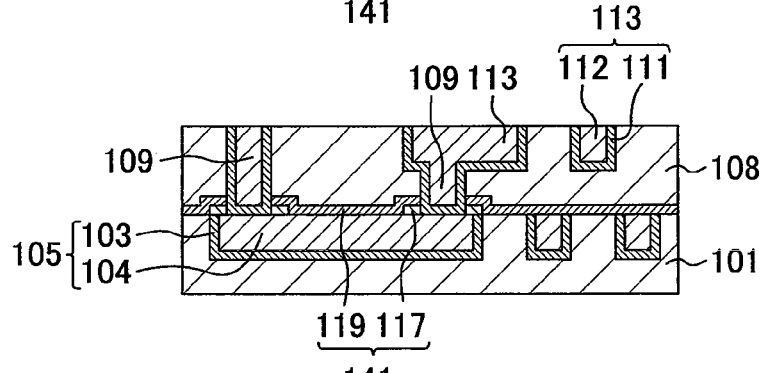

Then, as shown in FIG. 7C, the barrier metal film 111 and the Cu film 112 are deposited in this order on the surface of the interlayer insulating film 108, in the via holes 109a, and in the wiring grooves 110. Thereafter, part of the barrier metal film 111 and part of the Cu film 112 protruding out from the wiring grooves 110 are removed by performing a CMP process. Consequently, the vias 109 are formed in the via holes 109a, and the upper-level interconnects 113 are formed in the wiring grooves 110 (step (e)).

Figure 7D:
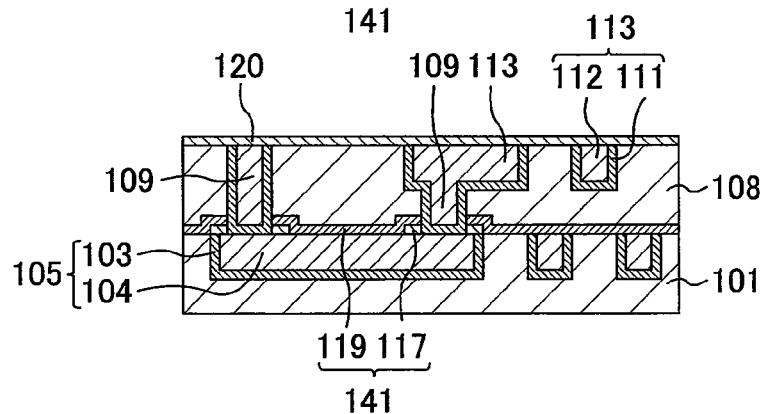

Next, as shown in FIG. 7D, the third liner insulating film 120 is deposited on the surfaces of the interlayer insulating film 108 and upper-level interconnects 113. In this embodiment, a SiCN film having a thickness of 10 nm is employed as the third liner insulating film 120.

Figure 7E:
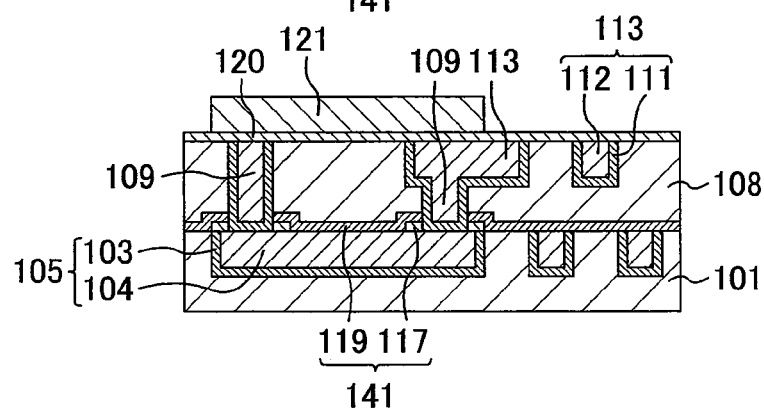

Then, as shown in FIG. 7E, a resist pattern 121 is formed on parts of the surface of the third liner insulating film 120 by lithography. Although the forthcoming fourth embodiment will describe the preferable location of the resist pattern 121 on the surface of the third liner insulating film 120, the resist pattern 121 is formed at least around the regions where the vias 109 have been formed.

Figure 8A:
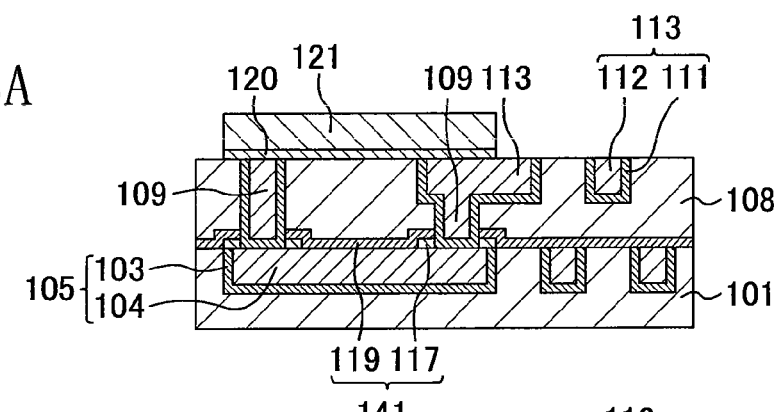
FIGS. 8A to 8D are cross-sectional views illustrating process steps in the method for fabricating the semiconductor device according to the second embodiment of the invention.

Next, as shown in FIG. 8A, the third liner insulating film 120 is etched with the resist pattern 121 used as a mask, thereby removing the parts of the third liner insulating film 120 that are not covered with the resist pattern 121. Consequently, the third liner insulating film 120 is formed only around the regions where the vias 109 have been formed, while the parts of the interlayer insulating film 108 and the parts of the upper-level interconnects 113 that are not masked with the resist pattern 121 are exposed.

Figure 8B:
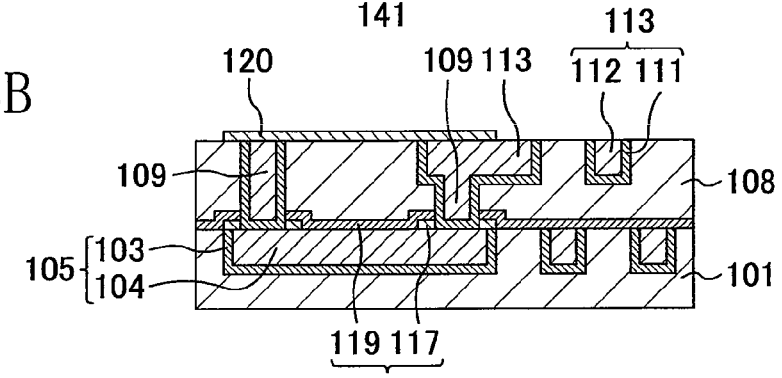

Then, as shown in FIG. 8B, the resist pattern 121 is removed.

Figure 8C:
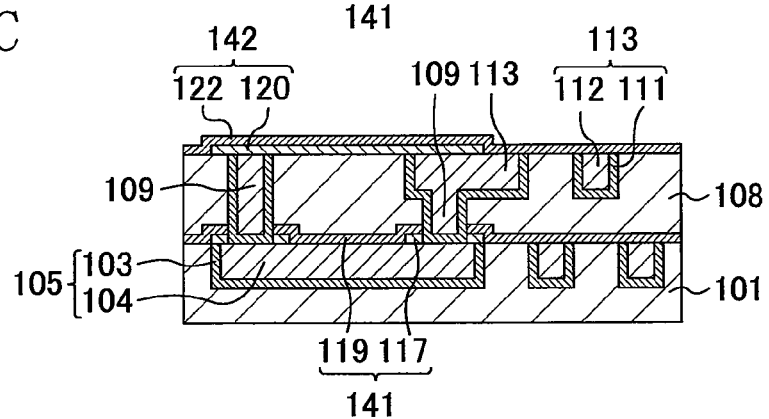

Subsequently, as shown in FIG. 8C, the fourth liner insulating film 122 is deposited on the surfaces of the interlayer insulating film 108, upper-level interconnects 113, and third liner insulating film 120. In this embodiment, a SiC film having a thickness of 10 nm is employed as the fourth liner insulating film 122. This process results in the formation of the liner insulating film 142 composed of the third and fourth liner insulating films 120 and 122 on the interlayer insulating film 108 and upper-level interconnects 113.

Lastly, the interlayer insulating film 116 is deposited on the surface of the fourth liner insulating film 122. Then, the surface of the interlayer insulating film 116 is planarized by performing a CMP process. This process completes the semiconductor device having the two-level interconnection structure shown in FIG. 8D. After that, repeating the process steps shown in FIGS. 7B to 8D also enables fabrication of a semiconductor device having a multilevel interconnection structure of any levels.

Figure 8D:
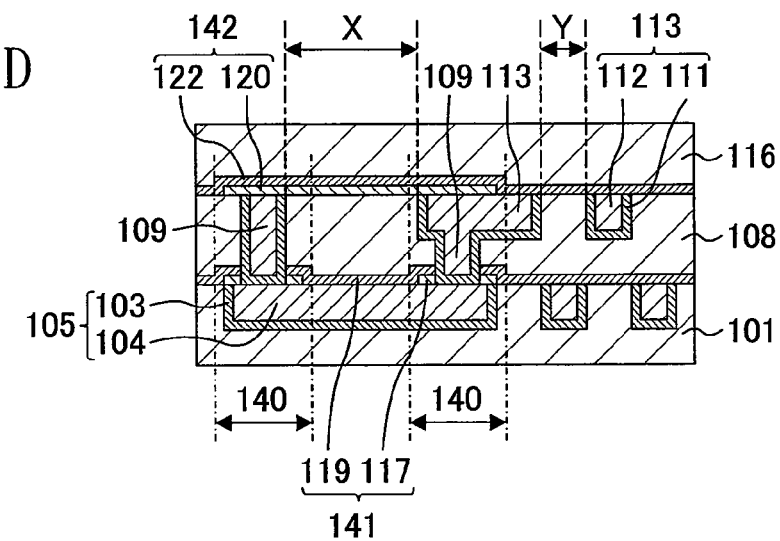

The two-level interconnection structure shown in FIG. 8D is characterized in that:

(1) around the lower ends of the vias 109, the first liner insulating film 117 is locally formed in the via-adjacent regions 140, and the second liner insulating film 119 is formed in the entire region. In other words, around the lower ends of the vias 109, the thickness of the liner insulating film 141 is locally increased in the via-adjacent regions 140; and (2) on or over the vias 109, the third liner insulating film 120 is locally formed in the via-adjacent regions 140, and the fourth liner insulating film 122 is formed in the entire region. In other words, on or over the vias 109, the thickness of the liner insulating film 142 is locally increased in the via-adjacent regions 140.

Characteristic (1) increases resistance to electromigration occurring when a current flows from the vias 109 into the lower-level interconnects 105. Characteristic (2) further increases the resistance to electromigration occurring when a current flows from the vias 109 into the lower-level interconnects 105. Characteristic (2) also increases resistance to electromigration occurring when a current flows from the vias 109 into the upper-level interconnects 113. This is because if the first and second liner insulating films 117 and 119 are regarded as a single liner insulating film, i.e., the liner insulating film 141, and the third and fourth liner insulating films 120 and 122 are regarded as a single liner insulating film, i.e., the liner insulating film 142, then the two-level interconnection structure shown in FIG. 8D is the same as the two-level interconnection structure shown in FIG. 4C.

Also, in this embodiment, the first and third liner insulating films 117 and 120 are made of SiCN, while the second and fourth liner insulating films 119 and 122 are made of SiC. The reason for this is as follows. For the first and third liner insulating films 117 and 120 provided to reinforce the interconnection structures located around the vias 109, SiCN films having high mechanical strength are employed from the viewpoint of ensuring electromigration resistance. On the other hand, for the second and fourth liner insulating films 119 and 122 covering the entire interconnection structures, SiC films having a low dielectric constant are employed from the viewpoint of reducing the capacitance between the interconnects. In this manner, the first and second liner insulating films 117 and 119 are formed using the different materials, and the third and fourth liner insulating films 120 and 122 are formed using the different materials. This enables the balance between the operating speed of the semiconductor device and electromigration resistance to be adjusted more properly.

Also, in the semiconductor device fabrication method according to this embodiment, as shown in FIGS. 6D and 8A, the first and third liner insulating films 117 and 120 are not formed outside the via-adjacent regions 140 and in the region where the distance between the interconnects is small. However, the first and third liner insulating films 117 and 120 may be formed in those regions. With consideration given to a balance of reducing the capacitance between the interconnects and ensuring the mechanical strength of the entire semiconductor device, the thicknesses of the first and second liner insulating films 117 and 119 in the liner insulating film 141, and the thicknesses of the third and fourth liner insulating films 120 and 122 in the liner insulating film 142 may be changed. Nevertheless, considering increase in the mechanical strength and reduction in the capacitance between the interconnects, the first and third liner insulating films 117 and 120 are preferably not formed outside the via-adjacent regions 140 in regions where the distances between interconnects are small.

As described above, in this embodiment as in the first embodiment, the parts of the liner insulating films 141 and 142 located in the via-adjacent regions 140 are thicker than the respective parts thereof located outside the via-adjacent regions 140. This reduces the capacitance between the interconnects, while increasing electromigration resistance.

Also, in this embodiment, since the liner insulating films 141 and 142 are each composed of an insulating film (the first or third liner insulating film 117 or 120) having high mechanical strength and an insulating film (the second or fourth liner insulating film 119 or 122) having a low dielectric constant, the balance between electromigration resistance and the operating speed of the semiconductor device is adjusted properly.

Third Embodiment

A semiconductor device according to a third embodiment of the present invention will be described with reference to FIG. 9. It should be noted that materials and numerical values cited below are only preferable examples, and the present invention is not limited to these materials and numerical values.

In the semiconductor device according to this embodiment, air gaps 127 are formed between adjacent lower-level interconnects 105 and 105, and air gaps 132 are formed between adjacent upper-level interconnects 113 and 113.

Figure 9:
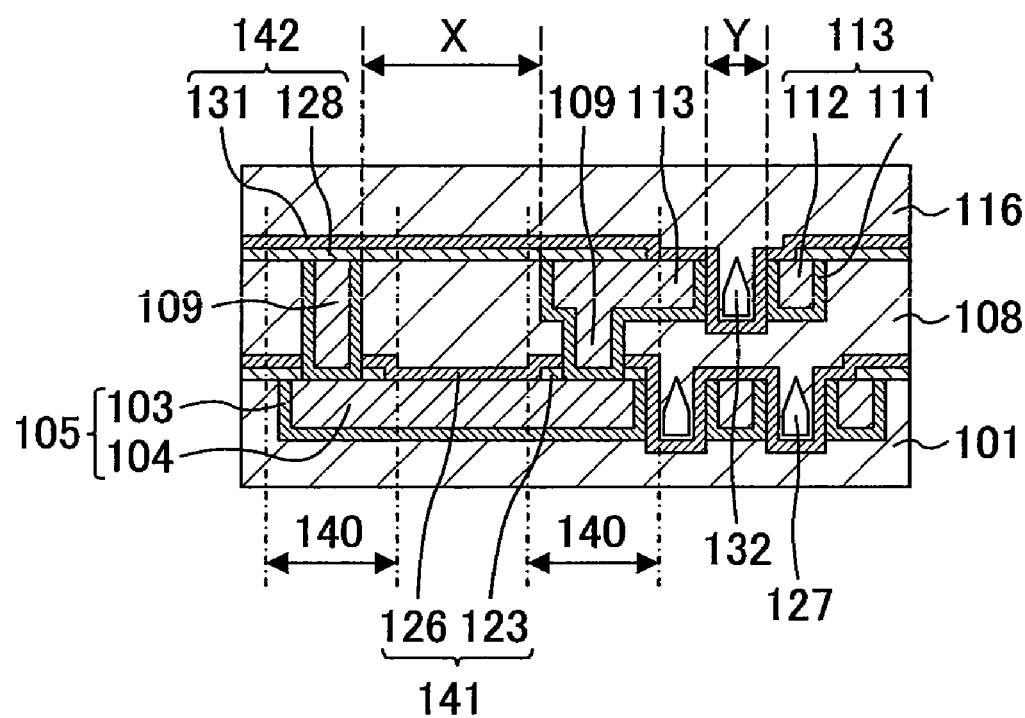
FIG. 9 is a cross-sectional view illustrating a semiconductor device according to a third embodiment of the invention.

As shown in FIG. 9, lower-level interconnects 105 are formed in an interlayer insulating film 101 formed on a semiconductor substrate (not shown). A first liner insulating film 123 is formed on the interlayer insulating film 101 and lower-level interconnects 105. A second liner insulating film 126 is formed over the first liner insulating film 123. The first and second liner insulating films 123 and 126 form a liner insulating film 141. An interlayer insulating film 108 is formed on the second liner insulating film 126. Vias 109, which are electrically connected with the lower-level interconnects 105, are formed in the first liner insulating film 123, second liner insulating film 126, and interlayer insulating film 108. In the interlayer insulating film 108, upper-level interconnects 113, which are electrically connected with the vias 109, are formed. A third liner insulating film 128 is formed on the interlayer insulating film 108 and upper-level interconnects 113. A fourth liner insulating film 131 is formed over the third liner insulating film 128. The third and fourth liner insulating films 128 and 131 form a liner insulating film 142. An interlayer insulating film 116 is formed on the fourth liner insulating film 131. A gap is formed at least between one of the adjacent pairs of the lower-level interconnects 105 and 105 and at least between one of the adjacent pairs of the upper-level interconnects 113 and 113. In each gap formed between the adjacent lower-level interconnects 105 and 105, the second liner insulating film 126 is formed on the bottom and side walls, and an air gap 127 covered with the interlayer insulating film 108 is formed. Likewise, in each gap formed between the adjacent upper-level interconnects 113 and 113, the fourth liner insulating film 131 is formed on the bottom and side walls, and an air gap 132 covered with the interlayer insulating film 116 is formed. In other words, the second and fourth liner insulating films 126 and 131 are formed along the bottoms and side walls of the air gaps 127 and 132, respectively.

In this embodiment, the interlayer insulating films 101, 108, and 116 are preferably insulating films having a low dielectric constant, such as SiOC films. The use of low-dielectric-constant films reduces the capacitance between the interconnects. As the first and third liner insulating films 123 and 128, insulating films having high mechanical strength are preferably employed from the viewpoint of preventing diffusion of Cu atoms in Cu films 104 in the lower-level interconnects 105 into the interlayer insulating film 108, and ensuring electromigration resistance; insulating films made of SiCN films, for example, are preferably employed. As the second and fourth liner insulating films 126 and 131, insulating films having a lower dielectric constant than the first and third liner insulating films 123 and 128 are preferably employed from the viewpoint of reducing the capacitance between the interconnects; insulating films made of SiC films, for example, are preferably employed. The lower-level interconnects 105 are each composed of a barrier metal film 103 and a conductive film made of a Cu film 104 or the like. The barrier metal film 103 is formed as the outer part of each lower-level interconnect 105 by a known method, and the conductive film is formed as the inner part. The upper-level interconnects 113 and the vias 109 are each composed of a barrier metal film 111 and a conductive film made of a Cu film 112 or the like. The barrier metal film 111 is formed as the outer part of each of the upper-level interconnects 113 and vias 109 by a known method, and the conductive film is formed as the inner part.

As in the first embodiment, the thickness of the liner insulating film 141 composed of the first and second liner insulating films 123 and 126 differs between via-adjacent regions 140, and an area outside the via-adjacent regions 140. That is, as shown in FIG. 9, around the lower ends of the vias 109, the parts of the liner insulating film 141 located in the via-adjacent regions 140 have a greater thickness than part thereof located outside the via-adjacent regions 140. Specifically, around the lower ends of the vias 109, the parts of the liner insulating film 114 located in the via-adjacent regions 140 have a thickness of 20 nm, while the part thereof located outside the via-adjacent regions 140 has a thickness of 10 nm. It should be noted that these thicknesses are provided only as examples. This local increase in the thickness of the liner insulating film 141 in the via-adjacent regions 140 around the lower ends of the vias 109 produces the effect of increasing resistance to electromigration occurring when a current flows from the vias 109 into the lower-level interconnects 105. To be specific, the liner insulating film 141 has higher mechanical strength than the interlayer insulating film 101 located around the lower ends of the vias 109. Thus, increasing the thickness of the parts of the inner insulating film 141 located in the via-adjacent regions 140 around the lower ends of the vias 109 increases the effective mechanical strength of the interconnection structures located around the vias 109. As a result, a phenomenon in which an increase in compressive stress affecting the Cu films 104 in the lower-level interconnects 105, caused by such electromigration, results in deformation of the interconnection structures located around the vias 109 is less likely to occur, thereby suppressing delamination at the interface between the interlayer insulating film 101 and the liner insulating film 141. Thus, the resistance to such electromigration increases.

As in the liner insulating film 141, the thickness of the liner insulating film 142 composed of the third and fourth liner insulating films 128 and 131 differs between the via-adjacent regions 140, and an area outside the via-adjacent regions 140. That is, as shown in FIG. 9, on or over the vias 109, the parts of the liner insulating film 142 located in the via-adjacent regions 140 have a greater thickness than part thereof located outside the via-adjacent regions 140. This local increase in the thickness of the liner insulating film 142 in the via-adjacent regions 140 on or over the vias 109, as in the case of the local increase in the thickness of the liner insulating film 141 in the via-adjacent regions 140 around the lower ends of the vias 109, increases the effective mechanical strength of the interconnection structures located around the vias 109, thereby producing the effect of increasing resistance to electromigration occurring when a current flows from the vias 109 into the lower-level interconnects 105. In addition, for the same reason as described above, this local increase in the thickness of the liner insulating film 142 also produces the effect of increasing resistance to electromigration occurring when a current flows from the vias 109 into the upper-level interconnects 113.

In this embodiment as in the first embodiment, the via-adjacent regions 140 are regions on the upper surfaces of the interlayer insulating films 101 and 108, whose length and width are equal to, or within, two to ten times greater than the diameter of a corresponding via and whose center matches the center of the corresponding via.

In this embodiment as in the second embodiment, the liner insulating films 141 and 142 are both multilayer films. Thus, around the lower ends of the vias 109, the first liner insulating film 123 may be formed only in the via-adjacent regions 140, and the second liner insulating film 126 may be formed on the entire upper surfaces of the interlayer insulating film 101 and lower-level interconnects 105. Likewise, on or over the vias 109, the third liner insulating film 128 may be formed only in the via-adjacent regions 140, and the fourth liner insulating film 131 may be formed on the entire upper surfaces of the interlayer insulating film 108 and upper-level interconnects 113. This reduces the capacitance between the interconnects, while increasing electromigration resistance.

Also, as in the second embodiment, the thickness of the first liner insulating film 123 may be equal to, or within, one to nine times greater than the thickness of the second liner insulating film 126, and thus may be 5 nm or more and 55 nm or less. Likewise, on or over the vias 109, the thickness of the third liner insulating film 128 may be equal to, or within, one to nine times greater than the thickness of the fourth liner insulating film 131, and thus may be 5 nm or more and 55 nm or less.

In this embodiment, when the distance between adjacent upper-level interconnects 113 and 113 outside the via-adjacent regions 140 is large, the thickness of the part of the liner insulating film 142 formed between these upper-level interconnects 113 and 113, as like the thickness of the parts thereof located in the via-adjacent regions 140, may be increased as compared to the parts thereof formed on the spaces between upper-level interconnects 113 and 113 which are located outside the via-adjacent regions 140 and which are not so large. As shown in FIG. 9, the interconnect distance X is larger than the interconnect distance Y. In this case, although the region in which the interconnect distance is X is located outside the via-adjacent regions 140, the liner insulating film 142 may have a greater thickness in that region than in other regions outside the via-adjacent regions 140. To that end, in this embodiment, outside the via-adjacent regions 140, the third liner insulating film 128 may be formed in the region in which the interconnect distance is X. The reason for this is as follows. When the distance between interconnects is large, the capacitance between these interconnects does not increase very much, and thus does not need to be reduced. In this case, it is therefore advantageous to ensure the mechanical strength of the entire semiconductor device rather than to reduce the thickness of the liner insulating film 142 to lower the capacitance between these interconnects. In this embodiment, the case in which the distance between interconnects is large means a case in which that distance is equal to or greater than twice the value of the smallest distance between interconnects in the semiconductor device. This also applies to the liner insulating film 141.

In FIG. 9, the first and third liner insulating films 123 and 128 are not formed outside the via-adjacent regions 140 and in the region where the distance between the interconnects is small. However, the first and third liner insulating films 123 and 128 may be formed in those regions. With consideration given to a balance of reducing the capacitance between the interconnects and ensuring the mechanical strength of the entire chip, the thicknesses of the first and second liner insulating films 123 and 126 in the liner insulating film 141, and the thicknesses of the third and fourth liner insulating films 128 and 131 in the liner insulating film 142 may be changed. Nevertheless, considering increase in the mechanical strength and reduction in the capacitance between the interconnects, the first and third liner insulating films 123 and 128 are preferably not formed outside the via-adjacent regions 140 and in regions where the distances between interconnects are small.

Also, the air gaps 127 are preferably not formed between adjacent lower-level interconnects 105 and 105 in which the distance is large, and the air gap 132 is preferably not formed between adjacent upper-level interconnects 113 and 113 in which the distance is large. As shown in FIG. 9, the interconnect distance X is larger than the interconnect distance Y, and it is preferable that no air gap be formed in the region in which the Interconnect distance is X. This is because if an air gap is formed between interconnects in which the distance is large, the top of the air gap cannot be closed even after the deposition of the interlayer insulating film 108, which may lead to the formation of a large recess in the surface of the interlayer insulating film 108. In this embodiment as described previously, the case in which the distance between interconnects is large means a case in which that distance is equal to or greater than twice the value of the smallest distance between interconnects in the semiconductor device.

Although the second or fourth liner insulating film 126 or 131 is formed on the bottom and side walls of each gap, the second and fourth liner insulating films 126 and 131 do not necessarily need to be formed in these locations. Nevertheless, it is preferable that the second or fourth liner insulating film 126 or 131 be formed on the bottom and side walls of each gap, because the presence of the second and fourth liner insulating films 126 and 131 in these locations not only facilitates the formation of the air gaps 127 and 132, but also increases the mechanical strength of the interconnects.

The following describes a method for fabricating the semiconductor device according to the third embodiment of the present invention with reference to FIGS. 10A to 12D. It should be noted that materials and numerical values cited below are only preferable examples, and the present invention is not limited to these materials and numerical values.

Figure 10A:
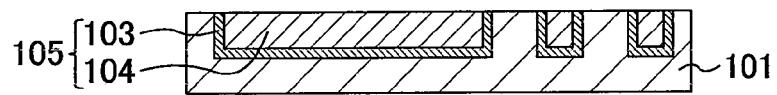
FIGS. 10A to 10G are cross-sectional views illustrating process steps in a method for fabricating the semiconductor device according to the third embodiment of the invention.

First, as shown in FIG. 10A, the lower-level interconnects 105 are formed in the interlayer insulating film 101. The lower-level interconnects 105 are formed in the same manner as in the semiconductor device fabrication method of the first embodiment, and the description thereof will be thus omitted herein.

Figure 10B:
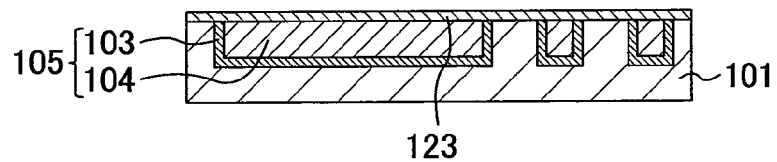

Next, as shown in FIG. 10B, the first liner insulating film 123 is deposited on the surfaces of the interlayer insulating film 101 and lower-level interconnects 105. In this embodiment, a SiCN film having a thickness of 10 nm is employed as the first liner insulating film 123.

Figure 10C:
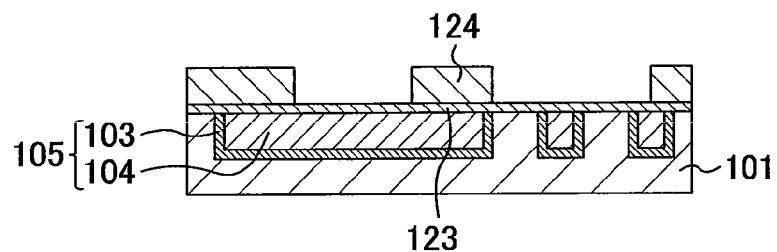

Subsequently, as shown in FIG. 10C, a resist pattern is formed on parts of the surface of the first liner insulating film 123 by lithography. Although the following fourth embodiment will describe the preferable location of the resist pattern 124 on the surface of the first liner insulating film 123, the resist pattern 124 is formed at least around the regions where the vias 109 are to be formed.

Figure 10D:
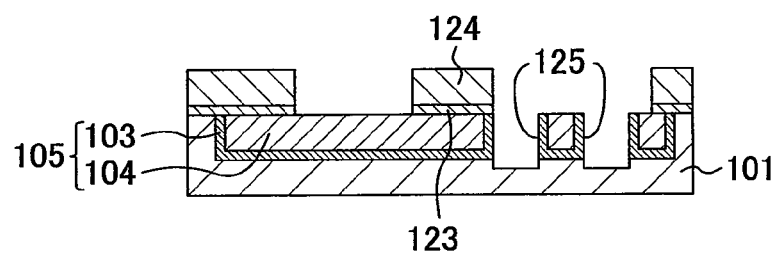

Next, as shown in FIG. 10D, the first liner insulating film 123 and the interlayer insulating film 101 are etched with the resist pattern 124 used as a mask. Consequently, the parts of the first liner insulating film 123 that are not covered with the resist pattern 124 are completely removed, and the parts of the interlayer insulating film 101 that are not covered with the resist pattern 124 are partially removed (step (c1)), however, the parts of the Cu films 104 that are not covered with the resist pattern are not removed. As a result, in the regions that are not masked with the resist pattern 124, the lower-level interconnects 105 and the interlayer insulating film 101 are partially exposed, and the gaps 125 are formed between the adjacent lower-level interconnects 105 and 105 (step (f)).

Figure 10E:
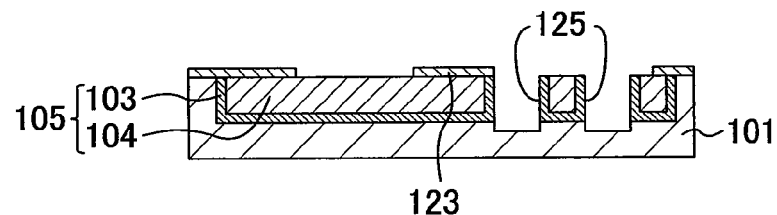

Then, as shown in FIG. 10E, the resist pattern 124 is removed.

Figure 10F:
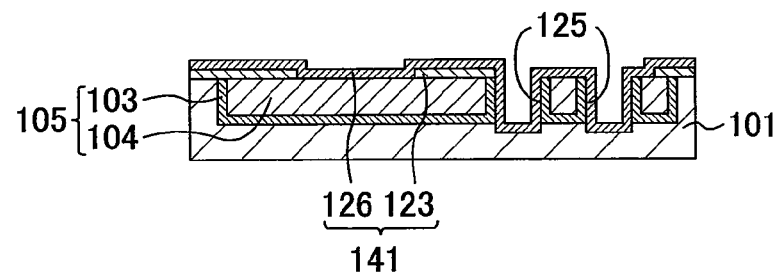

Next, as shown in FIG. 10F, the second liner insulating film 126 is deposited on the surfaces of the interlayer insulating film 101, lower-level interconnects 105 and first liner insulating film 123 (step (c2)). In this process step, the second liner insulating film 126 is also formed on the bottoms and side walls of the gaps 125. In this embodiment, a SiC film having a thickness of 10 nm is employed as the second liner insulating film 126.

Figure 10G:
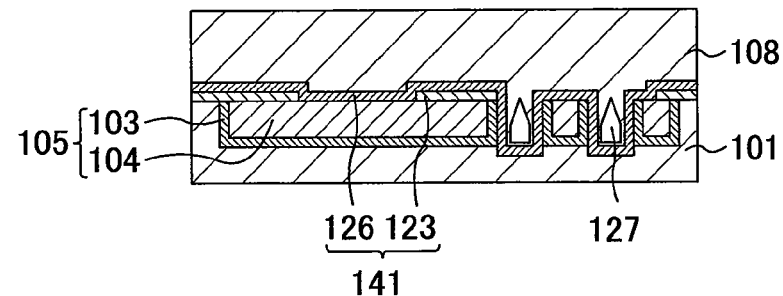

Subsequently, as shown in FIG. 10G, the interlayer insulating film 108 is deposited on the surface of the second liner insulating film 126 (step (d)). Thereafter, the surface of the interlayer insulating film 108 is planarized by performing a CMP process. Consequently, the air gaps 127 are formed between the adjacent lower-level interconnects 105 and 105.

Figure 11A:
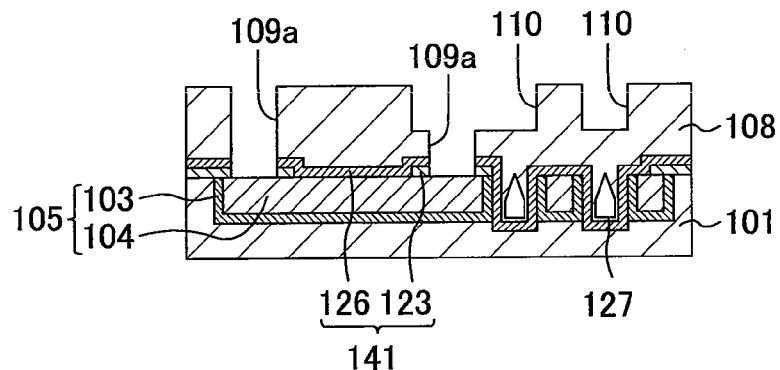
FIGS. 11A to 11D are cross-sectional views illustrating process steps in the method for fabricating the semiconductor device according to the third embodiment of the invention.

Next, as shown in FIG. 11A, via holes are formed in the first liner insulating film 123, second liner insulating film 126, and interlayer insulating film 108 by lithography and by dry etching, and the wiring grooves 110 are formed in the interlayer insulating film 108.

Figure 11B:
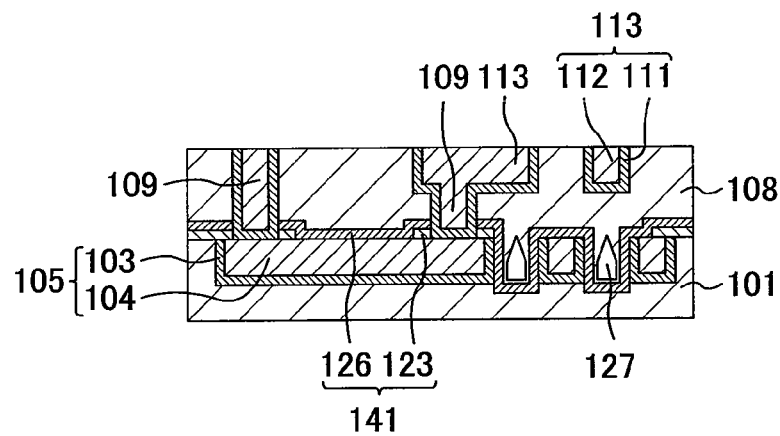

Then, as shown in FIG. 11B, the barrier metal film 111 and the Cu film 112 are deposited in this order on the surface of the interlayer insulating film 108, in the via holes 109a, and in the wiring grooves 110. Thereafter, part of the barrier metal film 111 and part of the Cu film 112 protruding out from the wiring grooves 110 are removed by performing a CMP process. Consequently, the vias 109 are formed in the via holes 109a, and the upper-level interconnects 113 are formed in the wiring grooves 110 (step (e)).

Figure 11C:
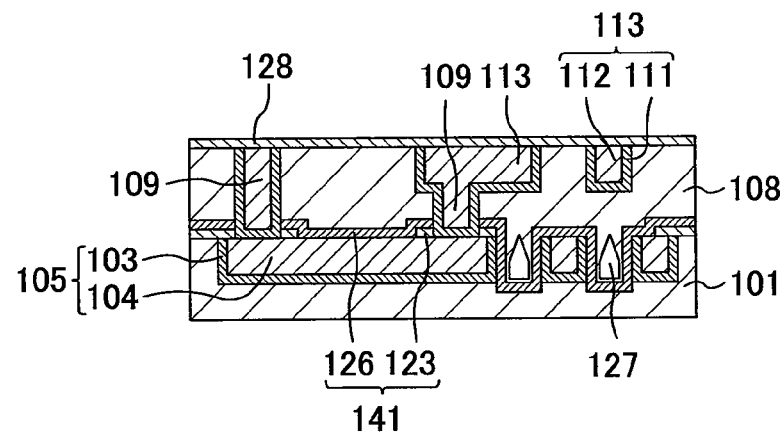

Next, as shown in FIG. 11C, the third liner insulating film 128 is deposited on the surfaces of the interlayer insulating film 108 and upper-level interconnects 113. In this embodiment, a SiCN film having a thickness of 10 nm is employed as the third liner insulating film 128.

Figure 11D:
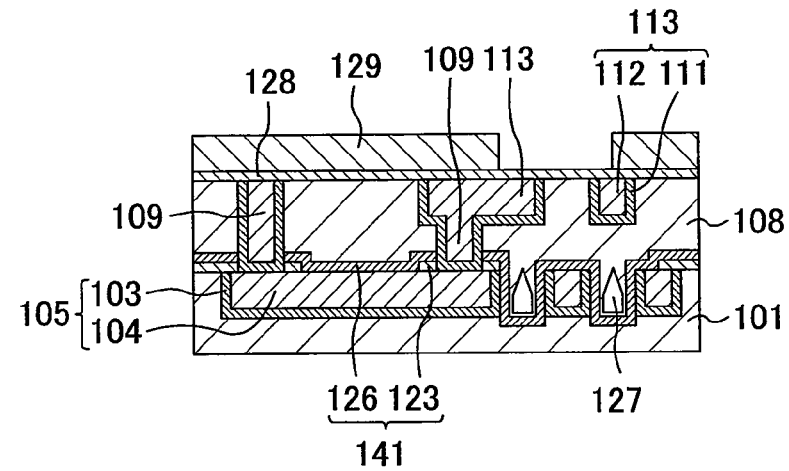

Subsequently, as shown in FIG. 11D, a resist pattern 129 is formed on parts of the surface of the third liner insulating film 128 by lithography. Although the following fourth embodiment will describe the preferable location of the resist pattern 129 on the surface of the third liner insulating film 128, the resist pattern 129 is formed at least around the regions where the vias 109 have been formed.

Figure 12A:
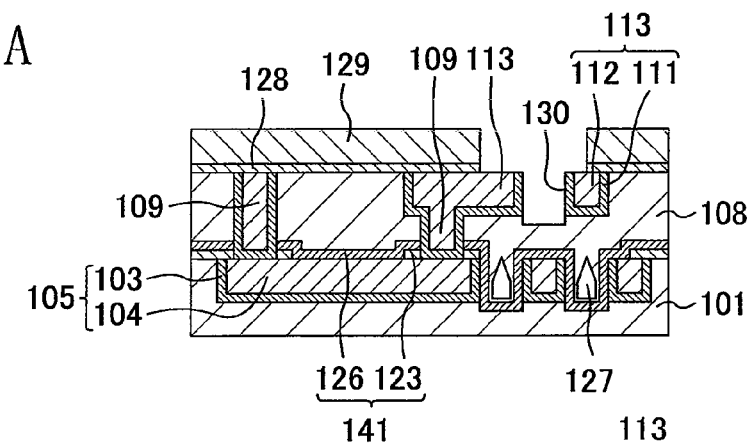
FIGS. 12A to 12D are cross-sectional views illustrating process steps in the method for fabricating the semiconductor device according to the third embodiment of the invention.

Next, as shown in FIG. 12A, the third liner insulating film 128 and the interlayer insulating film 108 are etched with the resist pattern 129 used as a mask. Consequently, the part of the third liner insulating film 128 that is not covered with the resist pattern 129 is completely removed, and the part of the interlayer insulating film 108 that is not covered with the resist pattern 129 is partially removed, however, the parts of the Cu films 112 that are not covered with the resist pattern are not removed. As a result, in the region that is not masked with the resist pattern 129, the upper-level interconnects 113 and the interlayer insulating film 108 are partially exposed, and the gap 130 is formed between the adjacent upper-level interconnects 113 and 113.

Figure 12B:
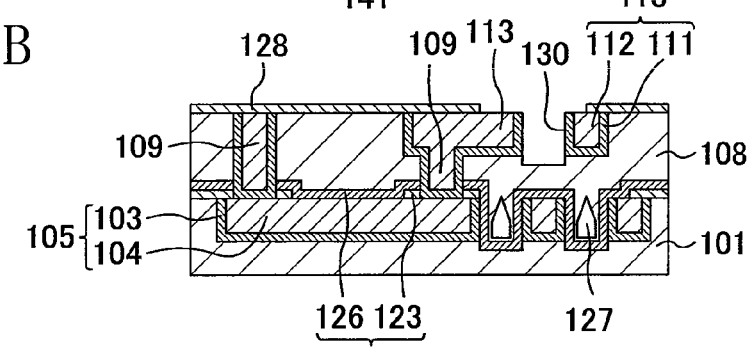

Then, as shown in FIG. 12B, the resist pattern 129 is removed.

Figure 12C:
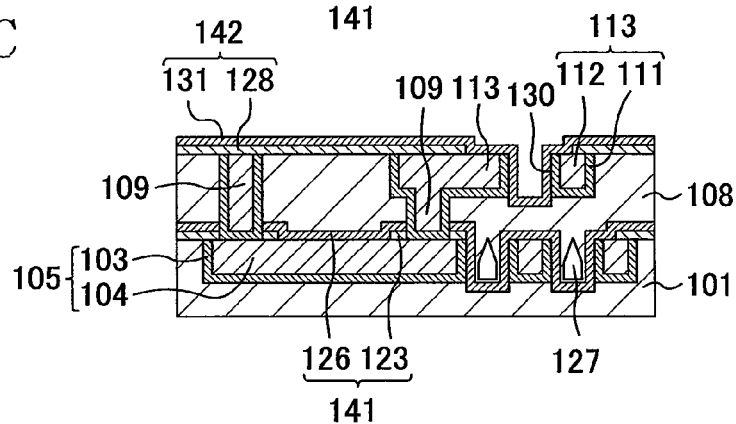

Subsequently, as shown in FIG. 12C, the fourth liner insulating film 131 is deposited on the surfaces of the interlayer insulating film 108, upper-level interconnects 113, and third liner insulating film 128. In this process step, the fourth liner insulating film 131 is also formed on the bottom and side walls of the gap 130. In this embodiment, a SiC film having a thickness of 10 nm is employed as the fourth liner insulating film 131.

Figure 12D:
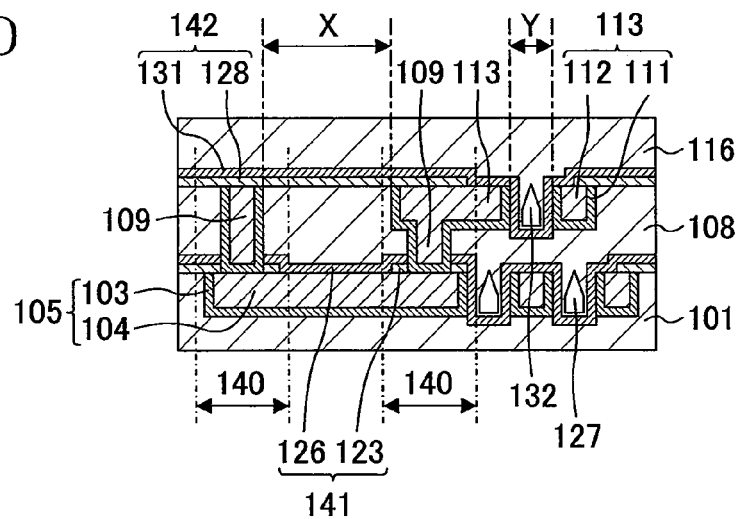

Lastly, the interlayer insulating film 116 is deposited on the surface of the fourth liner insulating film 131. Then, the surface of the interlayer insulating film 116 is planarized by performing a CMP process. Consequently, the air gap 132 is formed between the adjacent upper-level interconnects 113 and 113, and the semiconductor device having the two-level interconnection structure shown in FIG. 12D is completed. After that, repeating the process steps shown in FIGS. 11A to 12D also enables fabrication of a semiconductor device having a multilevel interconnection structure of any levels.

The two-level interconnection structure shown in FIG. 12D is characterized in that:

(1) around the lower ends of the vias 109, the first liner insulating film 123 is locally formed in the via-adjacent regions 140, and the second liner insulating film 126 is formed in the entire region. In other words, around the lower ends of the vias 109, the thickness of the liner insulating film 141 is locally increased in the via-adjacent regions 140;

(2) on or over the vias 109, the third liner insulating film 128 is locally formed in the via-adjacent regions 140, and the fourth liner insulating film 131 is formed in the entire region. In other words, on or over the vias 109, the thickness of the liner insulating film 142 is locally increased in the via-adjacent regions 140;

(3) the air gaps 127 are formed between the adjacent lower-level interconnects 105 and 105; and (4) the air gap 132 is formed between the adjacent upper-level interconnects 113 and 113.

Characteristic (1) increases resistance to electromigration occurring when a current flows from the vias 109 into the lower-level interconnects 105. Characteristic (2) further increases the resistance to electromigration occurring when a current flows from the vias 109 into the lower-level interconnects 105. Characteristic (2) also increases resistance to electromigration occurring when a current flows from the vias 109 into the upper-level interconnects 113. As set forth in the second embodiment, this is because if the first and second liner insulating films 123 and 126 are regarded as a single liner insulating film, i.e., the liner insulating film 141, and the third and fourth liner insulating films 128 and 131 are regarded as a single liner insulating film, i.e., the liner insulating film 142, then the two-level interconnection structure shown in FIG. 12D is the same as the two-level interconnection structure shown in FIG. 4C. Furthermore, characteristics (3) and (4) produce the effect of further reducing the capacitance between the adjacent lower-level interconnects 105 and 105 and the capacitance between the adjacent upper-level interconnects 113 and 113 as compared to the second embodiment.

Also, in this embodiment as in the second embodiment, the first and third liner insulating films 123 and 128 are made of SiCN, while the second and fourth liner insulating films 126 and 131 are made of SiC. The reason for this is as follows. For the first and third liner insulating films 123 and 128 provided to reinforce the interconnection structures located around the vias 109, SiCN films having high mechanical strength are employed from the viewpoint of ensuring electromigration resistance. On the other hand, for the second and fourth liner insulating films 126 and 131 covering the entire interconnection structures, SiC films having a low dielectric constant are employed from the viewpoint of reducing the capacitance between the interconnects. In this manner, the first and second liner insulating films 123 and 126 are formed using the different materials, and the third and fourth liner insulating films 128 and 131 are formed using the different materials. This enables the balance between the operating speed of the semiconductor device and electromigration resistance to be adjusted more properly.

As shown in FIGS. 10D and 12A, in the semiconductor device fabrication method of this embodiment as in the second embodiment, the first and third liner insulating films 123 and 128 are not formed outside the via-adjacent regions 140 and in the region where the distance between the interconnects is small. However, the first and third liner insulating films 123 and 128 may be formed in those regions. With consideration given to a balance of reducing the capacitance between the interconnects and ensuring the mechanical strength of the entire semiconductor device, the thicknesses of the first and second liner insulating films 123 and 126 in the liner insulating film 141, and the thicknesses of the third and fourth liner insulating films 128 and 131 in the liner insulating film 142 may be changed. Nevertheless, considering increase in the mechanical strength and reduction in the capacitance between the interconnects, the first and third liner insulating films 123 and 128 are preferably not formed outside the via-adjacent regions 140 and in regions where the distances between interconnects are small.

In FIG. 10F, the second liner insulating film is formed on the bottoms and side walls of the gaps 125. However, the second liner insulating film does not necessarily need to be formed in these locations. In a case in which the second liner insulating film 126 is not formed on the bottoms and side walls of the gaps 125, etching of the first liner insulating film 123 and etching of the interlayer insulating film 101 (the formation of the gaps 125) may be performed separately. Specifically, the following process steps may be performed. In FIG. 10C, the resist pattern 124 is also formed in the regions where the air gaps are to be formed. In FIG. 10D, only the first liner insulating film 123 is etched, and then the second liner insulating film 126 is formed over the first liner insulating film 123. Subsequently, the part of the surface of the second liner insulating film 126 other than in the regions where the gaps 125 are to be formed is covered with a resist, and then the interlayer insulating film 101 is etched to form the gaps 125. Thereafter, in FIG. 10G, the interlayer insulating film 108 is formed on the surface of the second liner insulating film 126, thereby forming the air gaps 127. Nevertheless, as shown in FIG. 10F, it is preferable that the second liner insulating film 126 be also formed on the bottoms and side walls of the gaps 125, because the presence of the second liner insulating film 126 in these locations facilitates the formation of the air gaps 127 and 132, and also increases the mechanical strength of the interconnects. This also applies to the case of forming the fourth liner insulating film 131 on the bottom and side walls of the gap 125 shown in FIG. 12C.

As described above, in this embodiment as in the first embodiment, the parts of the liner insulating films 141 and 142 located in the via-adjacent regions 140 have a greater thickness than the respective parts thereof located outside the via-adjacent regions 140. This reduces the capacitance between the interconnects, while increasing electromigration resistance.

Also, in this embodiment as in the second embodiment, the liner insulating films 141 and 142 are each composed of an insulating film having high mechanical strength and an insulating film having a low dielectric constant, thereby enabling more proper adjustment of the balance between electromigration resistance and the operating speed of the semiconductor device.

Furthermore, in this embodiment, the air gaps 127 are formed between the adjacent lower-level interconnects 105 and 105, and the air gap 132 is formed between the adjacent upper-level interconnects 113 and 113, thereby reducing the capacitance between the interconnects.

Forth Embodiment

In the fourth embodiment of the present invention, the preferable location of the resist pattern 107 in the first to third embodiments will be discussed with reference to FIG. 13.

The resist pattern 107 is preferably formed in the following regions on the surface of the liner insulating film 106 in accordance with the shapes of the lower-level interconnects 105 and vias 109.

1. Around the Vias 109

As set forth in the first to third embodiments, in order to increase electromigration resistance, a liner insulating film having high mechanical strength needs to be formed in the via-adjacent regions 140. To that end, the resist pattern 107 may be located around the regions on the surface of the liner insulating film 106 where the vias 109 are to be formed, so that the parts of the liner insulating film 106 located around those via 109 formation regions are left thick even after the completion of the etching of the liner insulating film 106. To achieve a sufficient increase in electromigration resistance, the dimension E of each thick part of the liner insulating film 106 in the vertical and horizontal directions is preferably equal to, or within, two to ten times greater than the diameter of a corresponding via 109.

2. Large Distance Between Adjacent Lower-Level Interconnects 105 and 105

As described in the first to third embodiments, when the distance S between adjacent lower-level interconnects 105A and 105B is sufficiently large, the capacitance between these interconnects presents no problem. In this case, from the viewpoint of ensuring the mechanical strength of the entire semiconductor device, it is advantageous to form the liner insulating film 106 of high mechanical strength in such a manner that the part thereof located between these adjacent interconnects 105A and 105B has an increased thickness. To that end, on the surface of the liner insulating film 106, the resist pattern 107 may also be formed between the adjacent lower-level interconnects 105A and 105B in which the interconnect distance is large, so that the part of the liner insulating film 106 located between these lower-level interconnects 105A and 105B is left thick even after the completion of the etching of the liner insulating film 106. It should be noted that the case in which the distance S between the adjacent lower-level interconnects 105A and 105B is sufficiently large generally means a case in which the distance S is equal to or greater than twice the value of the smallest distance between adjacent lower-level interconnects 105 and 105.

3. Space Between Parts of an Interconnect Having the Same Potential

Figure 13:
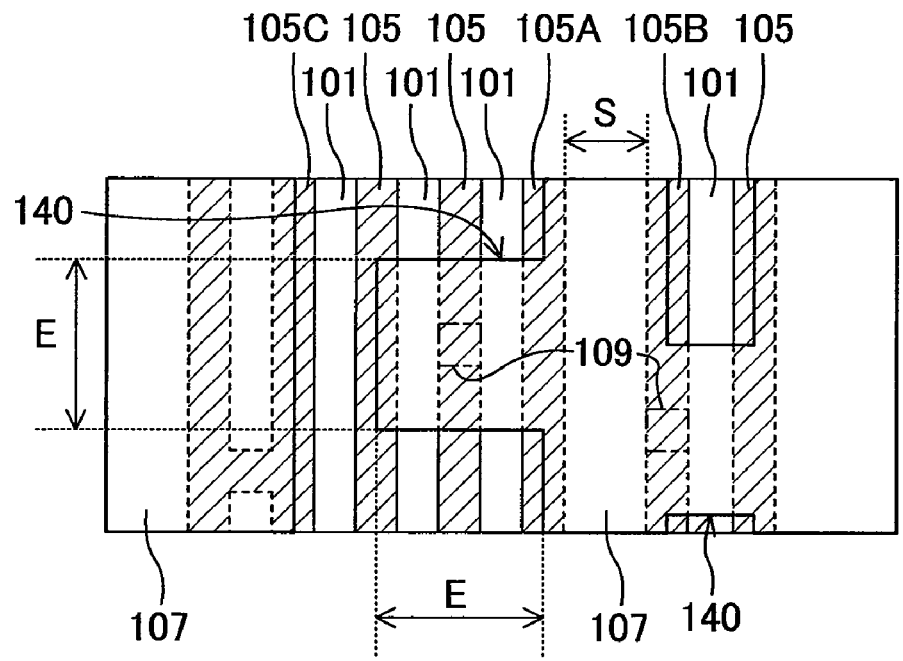
FIG. 13 is a plan view showing how a resist pattern for a semiconductor device is located according to a fourth embodiment of the invention.

For example, the lower-level interconnect 105C shown in FIG. 13 is composed of two parts extending in the vertical direction in FIG. 13 and a connection part formed between these two parts. In this case, although these two parts have sandwiched distances therebetween, the interconnect-to-interconnect capacitance in these two parts causes no problem because the two parts have the same potential. As in this case, when two parts of a lower-level interconnect having the same potential have a sandwiched distance or the like therebetween, the interconnect-to-interconnect capacitance in these two parts causes no problem. Therefore, from the viewpoint of ensuring the mechanical strength of the entire semiconductor device, it is advantageous that the liner insulating film 106 having high mechanical strength be also formed so as to have an increased thickness on the distances between parts of lower-level interconnects having the same potential. To that end, the resist pattern 107 may be formed over the distances between those parts of the lower-level interconnects having the same potential so that the parts of the liner insulating film 106 located between those parts having the same potential are left thick even after the completion of the etching of the liner insulating film 106.

4. Parts Which Overlie Interconnects

In order to suppress variation in the capacitance between the interconnects caused by a misalignment between the lower-level interconnects 105 and the overlying liner insulating film 106, the resist pattern 107 is preferably formed so as to overlie the lower-level interconnects 105 in the way shown in FIG. 13. By forming the resist pattern 107 so that ends thereof and the centers of lower-level interconnects 105 match, variation in the capacitance between the interconnects caused by such a misalignment is minimized.

In this manner, it is desired that the resist pattern 107 be formed not only in the areas located around the regions where the vias 109 are formed, but also in parts of the region surrounding those areas. Then, the liner insulating film 106 having high mechanical strength is also formed so as to have an increased thickness where the liner insulating film 106 is located in those parts of the region surrounding those areas. This further increases electromigration resistance.

This embodiment has been described by taking the resist pattern 107 as an example, but may be applicable to the other resist patterns by making the following substitutions for the lower-level interconnects 105 or the liner insulating film 106 in the above description. For example, for the resist pattern 115, the "lower-level interconnects 105" and the "liner insulating film 106" in the above description may be substituted by the "upper-level interconnects 113" and the "liner insulating film 114", respectively. For the resist patterns 118 and 124, the sentence "the liner insulating film 106 is formed so as to have an increased thickness" may be substituted by the sentence "the first liner insulating film 117 is formed" or "the first liner insulating film 123 is formed". For the resist patterns 121 and 129, the "lower-level interconnects 105" may be substituted by the "upper-level interconnects 113", and the sentence "the liner insulating film 106 is formed so as to have an increased thickness" may be substituted by the sentence "the third liner insulating film 120 is formed" or "the third liner insulating film 128 is formed".

Fifth Embodiment

In a fifth embodiment of the present invention, a description will be first made of a method for increasing electromigration resistance in a case in which the direction of current flow has already been determined at the time of fabrication of a semiconductor device. As described previously, an electromigration-caused failure is due to an occurrence in which an electron wind causes Cu atoms to move toward the anode terminal and hence damage the interconnection structure located around the via 109 of the anode terminal. Therefore, it is sufficient to reinforce the mechanical strength of the interconnection structure, which is the point of the present invention, only around the via 109 of the anode terminal. In light of this, FIG. 14 shows a modified example of the semiconductor device of the first embodiment.

Figure 14:
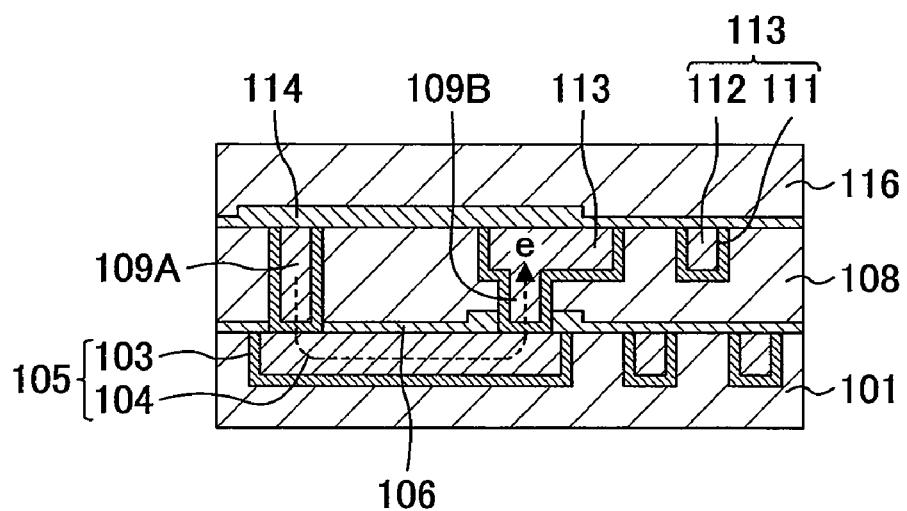
FIG. 14 is a cross-sectional view illustrating an example of a semiconductor device according to a fifth embodiment of the invention.

As in the semiconductor device shown in FIG. 14, in a situation in which an electron wind flows from the via 109A into the lower-level interconnect 105 and then into the via 109B, if compressive stress that affects the Cu film 104 in the lower-level interconnect 105 reaches a critical value, Cu atoms may protrude out from a part of the lower-level interconnect 105 that is in contact with the via 109B toward the interlayer insulating film 108. Therefore, in this semiconductor device, it is sufficient to increase the thickness of part of the liner insulating film 106 located around the lower surface of the via 109B. This increase reinforces the mechanical strength of the interconnection structure located around the lower surface of the via 109B, resulting in an increase in electromigration resistance.

As in this case, when the location of the protrusion of Cu atoms is known at the time of fabrication of the semiconductor device, the liner insulating film 106 may be formed so as to have an increased thickness only on that location. This enables electromigration resistance to increase sufficiently, while effectively reducing the capacitance between the interconnects. Moreover, the size of the region in which the liner film needs to be increased in thickness is reduced, thereby further lowering the capacitance between the interconnects.

Figure 15A:
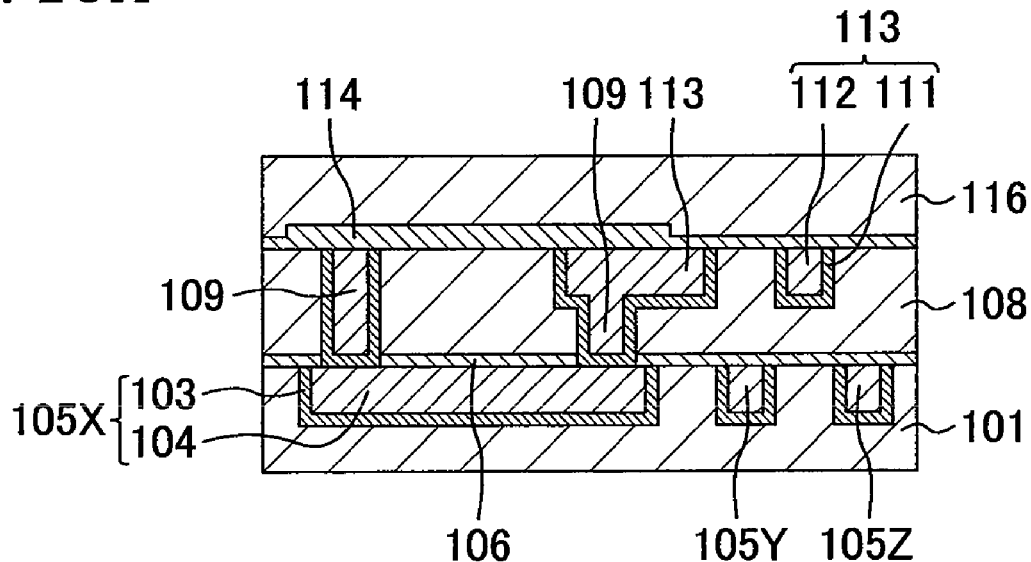
FIGS. 15A and 15B are cross-sectional views illustrating other examples of the semiconductor device according to the fifth embodiment of the invention.
Figure 15B:
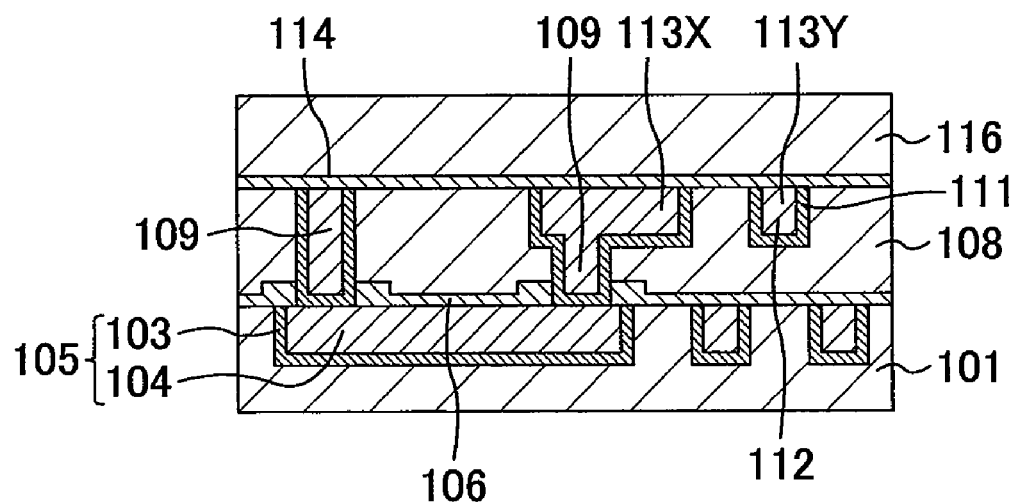
Figure 17A:
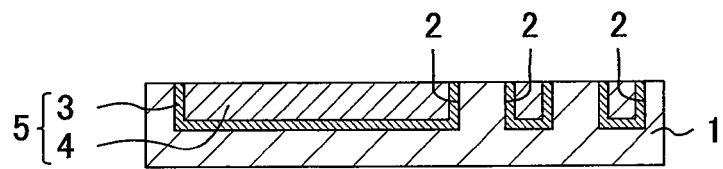
FIGS. 17A to 17E are cross-sectional views illustrating a method for fabricating a conventional semiconductor device.
Figure 17B:
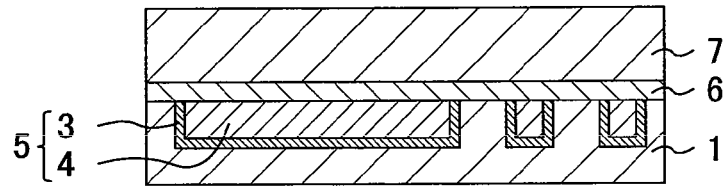
Figure 17C:
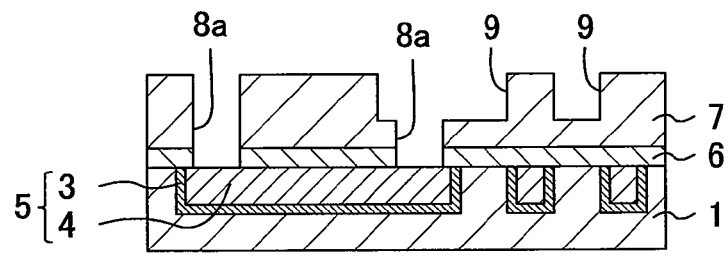
Figure 17D:
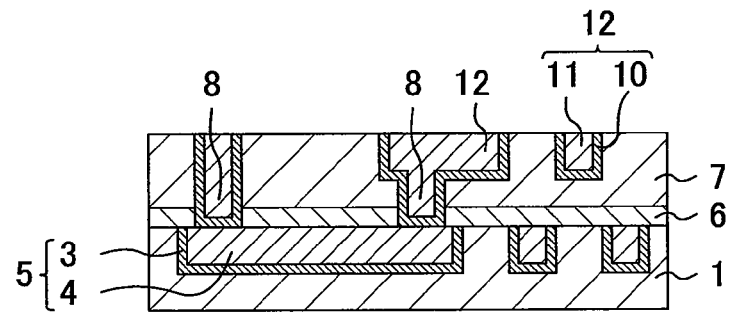
Figure 17E:
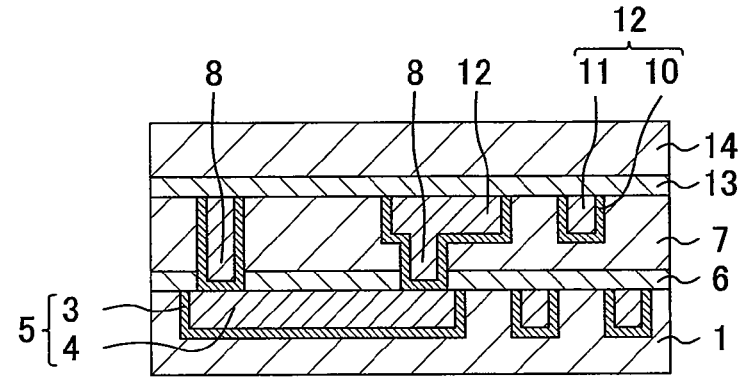
Figure 18A:
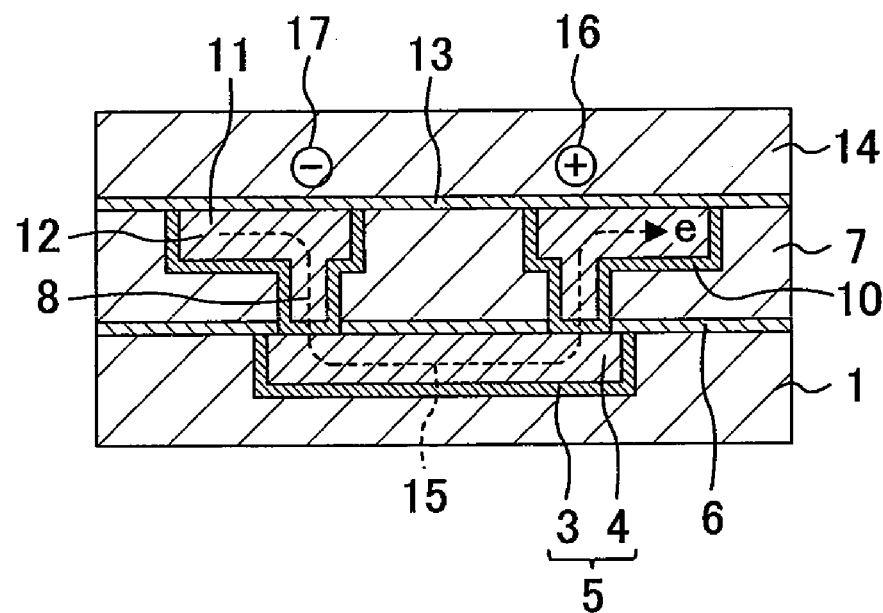
FIGS. 18A and 18B are cross-sectional views showing a problem with the conventional technique.
Figure 18B:
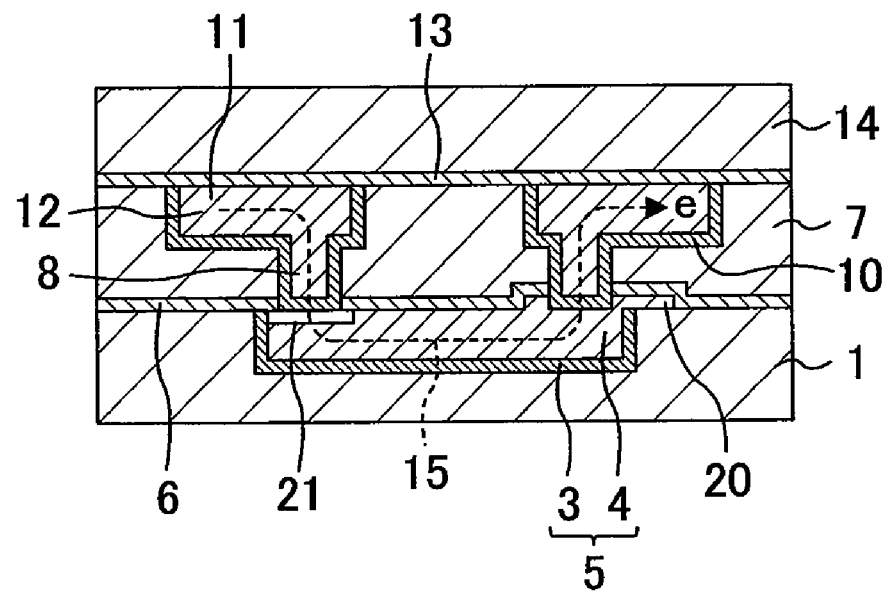
Figure 19A:
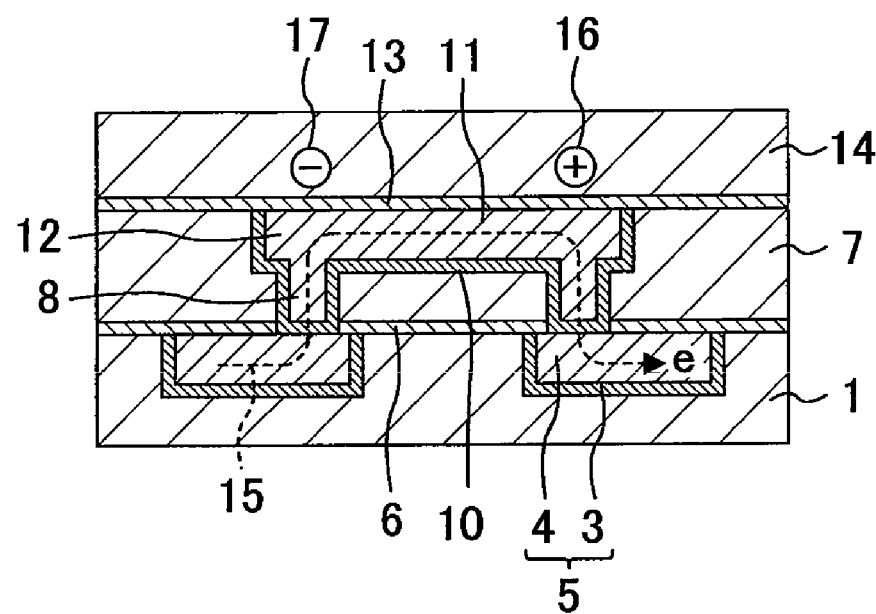
FIGS. 19A and 19B are cross-sectional views showing a problem with the conventional technique.
Figure 19B:
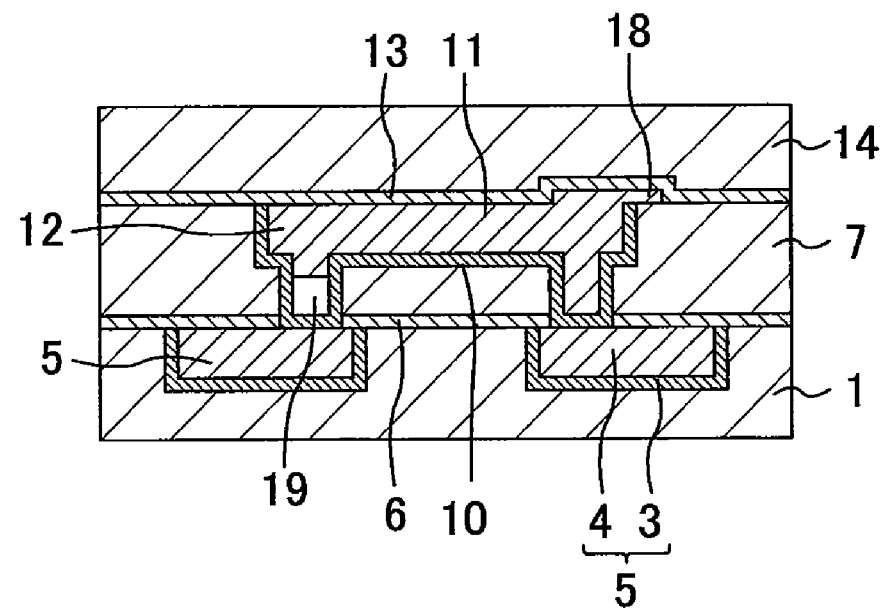

Next, a description will be made of a method for increasing electromigration resistance in a case in which a lower-level interconnect 105 or an upper-level interconnect 113 has a large width. When a lower-level interconnect 105 or an upper-level interconnect 113 has a large width, the electromigration resistance of that lower-level interconnect 105 or upper-level interconnect 113 is increased, thereby eliminating the need for reinforcing the mechanical strength of the interconnection structure located around the via 109 connected to that lower-level interconnect 105 or upper-level interconnect 113. In light of this, FIGS. 15A and 15B show modified examples of the semiconductor device of the first embodiment. FIG. 15A is a cross-sectional view of a semiconductor device in which a lower-level interconnect 105 has a large width. FIG. 15B is a cross-sectional view of a semiconductor device in which an upper-level interconnect 113 has a large width.

In the semiconductor device shown in FIG. 15A, the lower-level interconnect 105X has a greater width than the lower-level interconnects 105Y and 105Z, and a via 109 is connected with the lower-level interconnect 105X. Thus, the elecromigration resistance of the lower-level interconnect 105X is increased without increasing the thickness of the part of the liner insulating film 106 located in the via-adjacent region 140 around the lower end of the connected via 109.

In the semiconductor device shown in FIG. 15B, the upper-level interconnect 113X has a greater width than the upper-level interconnect 113Y, and a via 109 is connected with the upper-level interconnect 113X. Thus, the electromigration resistance of the upper-level interconnect 113X is increased without increasing the thickness of the part of the liner insulating film 114 located in the via-adjacent region 140 over the connected via 109.

The modified examples shown in FIGS. 14, 15A, and 15B are also applicable to the second to fourth embodiments described above and to sixth and seventh embodiments described below.

Sixth Embodiment

In the first to fifth embodiments, it has been assumed that the area where compressive stress that affects the Cu film 104 or 112 increases is on or over a via 109 or around the lower end of a via 109. However, depending on how a current flows, compressive stress that affects the Cu film 104 or 112 may also locally increase in a portion (a first portion) of a lower-level interconnect 105 or of an upper-level interconnect 113 in which the lower-level interconnect 105 or the upper-level interconnect 113 changes in width, bends, or divides.

Even if the first portion is located in a via-adjacent region 140, electromigration resistance increases because the liner insulating film 106 and/or other liner insulating films reinforce the mechanical strength of the interconnection structures located around the vias 109 as set forth in the first to fifth embodiments.

However, if the first portion is located outside the via-adjacent regions 140, the mechanical strength of the interconnection structure in the first portion may not be reinforced, which may cause a decline in electromigration resistance.

In view of this, the sixth embodiment of the present invention shows the structure of a semiconductor device in which the mechanical strength of the interconnection structure in the first portion is reinforced when the first portion is located outside the via-adjacent regions 140. Although a lower-level interconnect 105 will be discussed below, the following description is also applicable to upper-level interconnects 113.

FIGS. 16A, 16C, and 16E are top views each illustrating a fabrication process step for reinforcing the mechanical strength of the first portion 105a in which the lower-level interconnect 105 changes in width, bends, or divides. FIGS. 16A, 16C, and 16E are top views each illustrating the process step shown in FIG. 2E. FIGS. 16B, 16D, and 16F are cross-sectional views taken along the line XVIB-XVIB of FIG. 16A, along the line XVID-XVID of FIG. 16C, and along the line XVIF-XVIF of FIG. 16E, respectively.

When the first portion 105a is located outside the via-adjacent regions 140, the liner insulating film 106 is formed so that the part thereof located on the first portion 105a also has a greater thickness than the part thereof located on the other portion outside the via-adjacent regions 140, as shown in FIGS. 16A to 16F. This increases the mechanical strength of the first portion 105a, thereby increasing electromigration resistance.

To fabricate this semiconductor device, the location of the resist pattern 107 is changed from that in the semiconductor device fabrication methods described in the first and other embodiments. Specifically, the resist pattern 107 is formed not only on the parts of the liner insulating film 106 located in the via-adjacent regions 140, but also on the part thereof located on the first portion 105a, and the liner insulating film 106 is etched with the resist pattern 107 used as a mask. This results in the formation of the liner insulating film 106 in which the thickness on the first portion 105a is approximately the same as that in the via-adjacent regions 140.

This embodiment is also applicable to the second to fifth embodiments described above and to the following seventh embodiment.

Seventh Embodiment

In the other embodiment of the present invention, the liner insulating films, interlayer insulating films, and Cu films described in the first to sixth embodiments will be discussed in this order.

First, the preferable characteristics of the liner insulating films 106 and 114 in the first embodiment will be discussed. From the viewpoint of ensuring electromigration resistance, it is desired that films having a Young's modulus of 40 GPa or higher and having good adhesion to the Cu films 104 and 112 be employed as the liner insulating films 106 and 114. Examples of such films include a SiN film in addition to a SiCN film named in the first embodiment. This is also applicable to the first and third liner insulating films 117 and 120 in the second embodiment, to the first and third liner insulating films 123 and 128 in the third embodiment, and to the liner insulating films in the fourth to sixth embodiments.

Next, the preferable characteristics of the second and fourth liner insulating films 119 and 122 in the second embodiment will be discussed. From the viewpoint of lowering the capacitance between interconnects, films having a dielectric constant of 4.5 or lower and having good adhesion to the Cu films 104 and 112 are preferably employed as the second and fourth liner insulating films 119 and 122. Examples of such films include a SiCO film in addition to a SiC film named in the second embodiment. This is also applicable to the second and fourth liner insulating films 126 and 131 described in the third embodiment and to the liner insulating films described in the fourth to sixth embodiments.

To simplify the structures of the liner insulating films, the liner insulating films 106 and 114 are single layer films in the first embodiment, and the liner insulating films 141 and 142 are multilayer films composed of two layers in the second and third embodiments. Nevertheless, these liner insulating films may be multilayer films composed of three or more layers. Specifically, in the second embodiment, the first and third liner insulating films 117 and 120 may be multilayer films composed of two or more layers, or the second and fourth liner insulating films 119 and 122 may be multilayer films composed of two or more layers. These modifications may also be made in the fourth to sixth embodiments.

Next, the preferable characteristics of the interlayer insulating film 108 in the first to sixth embodiments will be discussed. From the viewpoint of lowering the capacitance between interconnects, a film having a dielectric constant of 3.0 or lower is preferably employed as the interlayer insulating film 108. Examples of such a film include a SiOC film having holes, a nano cavity silicon (NCS) film, a benzocyclobutene (BCB) film, a SiLK film (an organic polymer made by Dow Chemical Company), a Teflon® film, and a borazine film in addition to a SiOC film named in the first to third embodiments.

Also, in the first to sixth embodiments, the Cu films 104 in the lower-level interconnects 105 and the Cu films 112 in the upper-level interconnects 113 are both made principally of Cu films. Nevertheless, the present invention is applicable so long as either the lower-level interconnects 105 or the upper-level interconnects 113 are made principally of Cu films. In that case, the interconnects that are not made principally of Cu films may be Al interconnects, W interconnects, or interconnects of various other materials. In the case of Al interconnects or W interconnects, deposition of a liner insulating film on the surfaces of these interconnects is not necessary.

It will be understood that various changes and modifications may be made in the invention without departing from the spirit or scope of the invention.

What is claimed is:

1. A semiconductor device comprising:
    a semiconductor substrate;
    a first interlayer insulating film formed on the semiconductor substrate;
    first interconnects formed in the first interlayer insulating film;
    a liner insulating film formed on the first interlayer insulating film and on the first interconnects;
    a second interlayer insulating film formed on the liner insulating film;
    second interconnects formed in the second interlayer insulating film; and
    vias formed in the liner insulating film and in the second interlayer insulating film, and electrically connecting the first and second interconnects,
    wherein parts of the liner insulating film formed on a given first interconnect and in via-adjacent regions adjacent to the vias have a greater thickness than a part of the liner insulating film formed on the given first interconnect and outside the via-adjacent regions.

2. The semiconductor device of claim 1, wherein the liner insulating film is a multilayer film including a first liner insulating film and a second liner insulating film.

3. The semiconductor device of claim 2, wherein the first liner insulating film is not formed outside the via-adjacent regions.

4. The semiconductor device of claim 2, wherein the first liner insulating film has a Young's modulus of 40 GPa or higher.

5. The semiconductor device of claim 2, wherein the second liner insulating film has a dielectric constant of 4.5 or lower.

6. The semiconductor device of claim 2, wherein an air gap is formed between at least one of adjacent pairs of the first interconnects.

7. The semiconductor device of claim 6, wherein the air gap is formed in a gap formed between the one of the adjacent pairs of the first interconnects, and the second liner insulating film is formed on the bottom and side walls of the gap.

8. The semiconductor device of claim 1, wherein each of the via-adjacent regions is a region on the upper surface of the first interlayer insulating film, has a length and a width each equal to, or within, two to ten times greater than the diameter of a corresponding one of the vias, and has a center matching the center of the corresponding via.

9. The semiconductor device of claim 1, wherein the thickness of the parts of the liner insulating film formed in the via-adjacent regions is 10 nm or more and 100 nm or less.

10. The semiconductor device of claim 1, wherein, of the part of the liner insulating film formed outside the via-adjacent regions, a part formed on a distance between an adjacent pair of the first interconnects which is 2d or more has a greater thickness than a part formed on a distance between an adjacent pair of the first interconnects which is less than 2d, where d is the value of a smallest distance between adjacent pairs of the first interconnects.

11. The semiconductor device of claim 1, wherein a first portion, in which one of the first interconnects changes in width, bends, or divides, is present in a part of the upper surface of the first interlayer insulating film located outside the via-adjacent regions; and
    of the part of the liner insulating film formed outside the via-adjacent regions, a part formed on the first portion has a greater thickness than a part formed on a portion other than the first portion.

12. The semiconductor device of claim 1, wherein
    a third liner insulating film is formed on the second interconnects,
    parts of the third liner insulating film formed on the second interconnects and in via-adjacent regions have a greater thickness than a part of the third liner insulating film formed on the second interconnects and outside the via-adjacent regions.

13. The semiconductor device of claim 1, wherein
    a third liner insulating film is formed on the second interconnects,
    second vias different from the first vias are formed in the second interlayer insulating film, and are electrically connected to the first interconnects,
    parts of the liner insulating film formed on the first interconnects and in second via-adjacent regions adjacent to the second vias have a greater thickness than a part of the liner insulating film formed on the first interconnects and outside the via-adjacent regions,
    the third liner insulating film is formed on the second vias,
    parts of the third liner insulating film formed in regions between the second vias and the vias have a greater thickness than a part of the liner insulating film formed on the first interconnects and outside the via-adjacent regions.

14. The semiconductor device of claim 1, wherein
    a third liner insulating film is formed on the second interconnects,
    second vias different from the first vias are formed in the second interlayer insulating film, and are electrically connected to the first interconnects,
    parts of the liner insulating film formed on the first interconnects and in second via-adjacent regions adjacent to the second vias have a greater thickness than a part of the liner insulating film formed on the first interconnects and outside the via-adjacent regions,
    the third liner insulating film is formed on the second vias,
    parts of the third liner insulating film formed in regions between the second vias and the vias have a greater thickness than a part of the third liner insulating film formed on the second interconnects and outside the via-adjacent regions.

15. The semiconductor device of claim 2, wherein the first and second liner insulating films and are formed using different materials.

16. The semiconductor device of claim 2, wherein the second liner insulating film has a dielectric constant lower than that of the first liner insulating film.

17. The semiconductor device of claim 2, wherein the first liner insulating film is made of SiCN, and the second liner insulating film is made of SiC.

18. The semiconductor device of claim 1, wherein the liner insulating film has a single-layer portion, and a multi-layer portion, and
a portion of the liner insulating film which is in contact with the vias is the multi-layer portion.

19. The semiconductor device of claim 6, wherein the air gap is in contact with the second interlayer insulating film.

20. The semiconductor device of claim 7, wherein the second interlayer insulating film is formed between the gap and the air gap.

21. The semiconductor device of claim 1, wherein of the liner insulating film, a portion formed on the bottom and side walls of the gap is a single-layer film.

22. The semiconductor device of claim 6, wherein of the part of the liner insulating film formed outside the via-adjacent regions, the air gap is not formed on a part formed on a distance between an adjacent pair of the first interconnects which is more than d, where d is a distance between adjacent pairs of the first interconnects.

23. A semiconductor device comprising:
a semiconductor substrate;
a first interlayer insulating film formed on the semiconductor substrate;
first interconnects formed in the first interlayer insulating film;
a second interlayer insulating film formed on the first interlayer insulating film and on the first interconnects;
second interconnects formed in the second interlayer insulating film;
vias formed in the second interlayer insulating film, and electrically connecting the first and second interconnects, and
a liner insulating film formed on the second interlayer insulating film and on the second interconnects,
wherein parts of the liner insulating film formed on a given second interconnect and in via-adjacent regions adjacent to the vias have a greater thickness than a part of the liner insulating film formed on the given second interconnect and outside the via-adjacent regions.

24. The semiconductor device of claim 23, wherein the first and second liner insulating films and are formed using different materials.

25. The semiconductor device of claim 23, wherein the second liner insulating film has a dielectric constant lower than that of the first liner insulating film.

26. The semiconductor device of claim 23, wherein the first liner insulating film is made of SiCN, and the second liner insulating film is made of SiC.

* * * * *